(12) United States Patent
Ashizawa

(10) Patent No.: US 10,930,522 B2
(45) Date of Patent: Feb. 23, 2021

(54) SEMICONDUCTOR LAYER, OSCILLATION ELEMENT, AND SEMICONDUCTOR LAYER MANUFACTURING METHOD

(71) Applicant: UACJ Corporation, Tokyo (JP)

(72) Inventor: Koichi Ashizawa, Tokyo (JP)

(73) Assignee: UACJ Corporation, Tokyo (JP)

( * ) Notice: Subject to any disclaimer, the term of this patent is extended or adjusted under 35 U.S.C. 154(b) by 0 days.

(21) Appl. No.: 16/620,221

(22) PCT Filed: Jun. 8, 2018

(86) PCT No.: PCT/JP2018/022013
§ 371 (c)(1),
(2) Date: Dec. 6, 2019

(87) PCT Pub. No.: WO2018/225855
PCT Pub. Date: Dec. 13, 2018

(65) Prior Publication Data
US 2020/0135494 A1 Apr. 30, 2020

(30) Foreign Application Priority Data

Jun. 9, 2017 (JP) ................. 2017-114559

(51) Int. Cl.
*H01L 21/00* (2006.01)
*H01L 21/479* (2006.01)
(Continued)

(52) U.S. Cl.
CPC .......... *H01L 21/479* (2013.01); *H01L 21/477* (2013.01); *H01L 29/242* (2013.01);
(Continued)

(58) Field of Classification Search
None
See application file for complete search history.

(56) References Cited

U.S. PATENT DOCUMENTS

| 5,848,985 A | 12/1998 | Muroki |
| 5,944,685 A | 8/1999 | Muroki |
| 2019/0157380 A1 | 5/2019 | Fujita et al. |

FOREIGN PATENT DOCUMENTS

| JP | 09-215755 | 8/1997 |
| JP | 2016-051825 A | 4/2016 |

(Continued)

OTHER PUBLICATIONS

International Search Report dated Aug. 28, 2018 in corresponding International Patent Application No. PCT/JP2018/022013.
(Continued)

*Primary Examiner* — Reema Patel
(74) *Attorney, Agent, or Firm* — Mintz Levin Cohn Ferris Glovsky and Popeo, P. C.; David G. Conlin; Steven M. Jensen

(57) ABSTRACT

A semiconductor layer of the present invention is a semiconductor layer including: a pn junction at which an n-type semiconductor ($Al_2O_3$ (n-type)) and a p-type semiconductor ($Al_2O_3$ (p-type)) are joined, the n-type semiconductor ($Al_2O_3$ (n-type)) having a donor level that is formed by causing an aluminum oxide film ($Al_2O_3$) to excessively contain aluminum (Al), the p-type semiconductor ($Al_2O_3$ (p-type)) having an acceptor level that is formed by causing an aluminum oxide film ($Al_2O_3$) to excessively contain oxygen (O).

13 Claims, 19 Drawing Sheets

(51) Int. Cl.
*H01L 21/477* (2006.01)
*H01L 29/24* (2006.01)
*H01L 29/66* (2006.01)
*H01L 29/861* (2006.01)
*H01L 29/88* (2006.01)

(52) U.S. Cl.
CPC ...... *H01L 29/247* (2013.01); *H01L 29/66969* (2013.01); *H01L 29/8611* (2013.01); *H01L 29/88* (2013.01)

(56) References Cited

FOREIGN PATENT DOCUMENTS

WO 2016/175251 A1 11/2016
WO 2018/004009 1/2018

OTHER PUBLICATIONS

International Preliminary Report on Patentability dated Dec. 19, 2019 in corresponding International Patent Application No. PCT/JP2018/022013.

(Liquid: Ionized state)

(a)

(b)

(c)

(Liquid: Ionized state)

At low carrier concentration (a≪b)

US 10,930,522 B2

SEMICONDUCTOR LAYER, OSCILLATION ELEMENT, AND SEMICONDUCTOR LAYER MANUFACTURING METHOD

TECHNICAL FIELD

The present invention relates to a semiconductor layer, an oscillation element, and a semiconductor layer manufacturing method.

BACKGROUND ART

In the field of semiconductors, the semiconductors are required to have higher power, have a higher withstanding voltage, operate at a high temperature, and have a higher frequency. It is particularly important for the semiconductors to have a higher withstanding voltage. Thus, a wide band gap semiconductor that has a wider band gap than a conventional Si-based semiconductor is desired. Si has a band gap of 1.12 eV. In contrast, SiC and GaN, each of which is attracting attention as a wide band gap semiconductor, have respective band gaps of (i) 2.20 eV to 3.02 eV and (ii) 3.39 eV. Thus, a wide band gap semiconductor that has a wider band gap is under development.

In Patent Literature 1, the inventor of the present invention examines, in detail, (i) an oscillation element in which a semiconductor layer containing an aluminum oxide as a base material is used and (ii) an oscillation element manufacturing method.

CITATION LIST

Patent Literature

[Patent Literature 1]
International Publication No. WO 2016/175251

SUMMARY OF INVENTION

Technical Problem

For example, diamond that has a band gap of 5.47 eV is attracting attention as a wide band gap semiconductor material. Note, however, that, since diamond is not a semiconductor, it is necessary to form a donor level and an acceptor level by carrying out ion implantation with respect to the diamond. Note, however, ion implantation in diamond needs to be carried out at a high temperature and a high pressure and thus cannot be easily carried out.

In contrast, an aluminum oxide has a band gap of 8.8 eV, and it is attractive that the aluminum oxide can be used as a material of a wide band gap semiconductor. Note, however, that it has been difficult to form a donor level and an acceptor level in the band gap. In particular, it has been difficult to form an acceptor level. Under the circumstances, an aluminum oxide is highly reliable as a quite excellent insulator, but it has been difficult to form a p-type semiconductor and a pn junction in each of which an aluminum oxide is used.

Thus, in order to obtain (i) a semiconductor that contains, as a base material, an aluminum oxide that has a wide band gap, (ii) a semiconductor device and an oscillation element in each of which the semiconductor is used, it is an object to find a technique for obtaining a donor level and an acceptor level by filling a band of an aluminum oxide with carriers. Note that there is neither a prior art document in which an aluminum oxide is made into a semiconductor nor a prior art document concerning a pn junction of an aluminum oxide semiconductor. Thus, it is an object to carry out pn junction formation, which is a basic function of a semiconductor that contains an aluminum oxide as a base material.

As described in Patent Literature 1, the inventor of the present invention succeeded in producing a semiconductor layer that contains an aluminum oxide as a base material and has a Schottky junction. Furthermore, the inventor of the present invention found that oscillation is observed in an electric current by causing a depletion layer of the semiconductor layer to have an extremely thin thickness, passing a tunnel current through the semiconductor layer, and applying a voltage to the semiconductor layer in a reverse bias direction. In addition, the inventor of the present invention confirmed that the oscillation in electric current is visible at an electric current density that is not more than a predetermined high electric current density.

In a case where an inverter that converts, into an alternating current, a direct current flowing through a battery or the like is designed with use of an oscillation element invented by the inventor of the present invention, electric current oscillation is desired to occur by application of a wide bias voltage, including a zero bias voltage, from a forward bias voltage side to a backward bias voltage side.

However, the electric current oscillation occurs only in the case of application of a backward bias voltage, but the electric current oscillation does not occur by application of a forward bias voltage or a zero bias voltage. This causes an inverter circuit in which the oscillation element is used to have a complicated circuit configuration. Thus, it is an object to find (i) an oscillation element in which electric current oscillation is caused by application of a wide bias voltage, including a zero bias voltage, from a forward bias voltage side to a backward bias voltage side and (ii) a method for manufacturing the oscillation element.

An aspect of the present invention has been newly attained based on further research carried out by the inventor of the present invention, and an object of an aspect of the present invention is to achieve (i) a semiconductor layer that is more excellent in performance than a conventional semiconductor layer, (ii) an oscillation element, and (iii) a semiconductor layer manufacturing method.

Solution to Problem

In order to attain the object, a semiconductor layer in accordance with an aspect of the present invention includes: a pn junction at which an n-type semiconductor and a p-type semiconductor are joined, the n-type semiconductor having a donor level that is formed by causing an aluminum oxide film to excessively contain aluminum, the p-type semiconductor having an acceptor level that is formed by causing an aluminum oxide film to excessively contain oxygen.

A semiconductor layer in accordance with a further aspect of the present invention includes a p-type semiconductor having an acceptor level that is formed by causing an aluminum oxide film to excessively contain oxygen.

A method in accordance with a further aspect of the present invention for manufacturing a semiconductor layer includes the steps of: bringing metallic aluminum and a probe into contact with a first surface and a second surface, respectively, of an aluminum oxide film so as to melt the aluminum oxide film in atmosphere, oxygen-containing gas, or oxygen gas by applying, between the metallic aluminum serving as an anode and the probe serving as a cathode, a voltage at which a dielectric breakdown occurs in the aluminum oxide film; and by causing, in the aluminum oxide film which is being melted, a molten salt electrolysis reaction so as to cool the aluminum oxide film, forming an n-type semiconductor layer and a p-type semiconductor layer on the metallic aluminum side and the probe side, respectively, of the aluminum oxide film, and joining the n-type semiconductor layer and the p-type semiconductor layer.

A method in accordance with a further aspect of the present invention for manufacturing a semiconductor layer includes the steps of: bringing metallic aluminum and a probe into contact with a first surface and a second surface, respectively, of an aluminum oxide film so as to melt the aluminum oxide film in atmosphere, gas, or a vacuum by applying, between the metallic aluminum serving as a cathode and the probe serving as an anode, a voltage at which a dielectric breakdown occurs in the aluminum oxide film; and by causing, in the aluminum oxide film which is being melted, a molten salt electrolysis reaction so as to cool the aluminum oxide film, forming a p-type semiconductor layer and an n-type semiconductor layer on the metallic aluminum side and the probe side, respectively, of the aluminum oxide film, and joining the n-type semiconductor layer and the p-type semiconductor layer.

The molten salt electrolysis reaction is preferably caused in the aluminum oxide film by making a donor concentration of the n-type semiconductor and an acceptor concentration of the p-type semiconductor controllable by adjusting coulomb amount that causes the molten salt electrolysis reaction.

The molten salt electrolysis reaction is preferably caused in the aluminum oxide film by moving the probe while bringing the probe into contact with the aluminum oxide film.

The probe which is being brought into contact with the aluminum oxide film is preferably moved by (1) continuously changing the applied voltage, (2) discontinuously changing the applied voltage, (3) unidirectionally or bidirectionally changing a polarity of the applied voltage, or changing the applied voltage by combining (1) through (3).

An oscillation element in accordance with a further aspect of the present invention includes: a pn junction at which an n-type semiconductor and a p-type semiconductor are joined, the n-type semiconductor having a donor level that is formed by causing an aluminum oxide film to excessively contain aluminum, the p-type semiconductor having an acceptor level that is formed by causing an aluminum oxide film to excessively contain oxygen.

A method in accordance with a further aspect of the present invention for manufacturing an oscillation element includes the steps of: bringing metallic aluminum and a probe into contact with a first surface and a second surface, respectively, of an aluminum oxide film so as to melt the aluminum oxide film in atmosphere, oxygen-containing gas, or oxygen gas by applying, between the metallic aluminum serving as an anode and the probe serving as a cathode, a voltage at which a dielectric breakdown occurs in the aluminum oxide film; and by causing, in the aluminum oxide film which is being melted, a molten salt electrolysis reaction so as to cool the aluminum oxide film, forming an n-type semiconductor layer and a p-type semiconductor layer on the metallic aluminum side and the probe side, respectively, of the aluminum oxide film, and joining the n-type semiconductor layer and the p-type semiconductor layer, a depletion layer, formed by joining the n-type semiconductor layer and the p-type semiconductor layer, having a thickness of not more than 1 nm.

A method in accordance with a further aspect of the present invention for manufacturing an oscillation element includes the steps of: bringing metallic aluminum and a probe into contact with a first surface and a second surface, respectively, of an aluminum oxide film so as to melt the aluminum oxide film in atmosphere, gas, or a vacuum by applying, between the metallic aluminum serving as a cathode and the probe serving as an anode, a voltage at which a dielectric breakdown occurs in the aluminum oxide film; and by causing, in the aluminum oxide film which is being melted, a molten salt electrolysis reaction so as to cool the aluminum oxide film, forming a p-type semiconductor layer and an n-type semiconductor layer on the metallic aluminum side and the probe side, respectively, of the aluminum oxide film, and joining the n-type semiconductor layer and the p-type semiconductor layer, a depletion layer, formed by joining the n-type semiconductor layer and the p-type semiconductor layer, having a thickness of not more than 1 nm.

The molten salt electrolysis reaction is preferably caused in the aluminum oxide film by moving the probe while bringing the probe into contact with the aluminum oxide film.

Advantageous Effects of Invention

An aspect of the present invention brings about an effect of achieving (i) a semiconductor layer that is more excellent in performance than a conventional semiconductor layer, (ii) an oscillation element, and (iii) a semiconductor layer manufacturing method.

Figure 24:
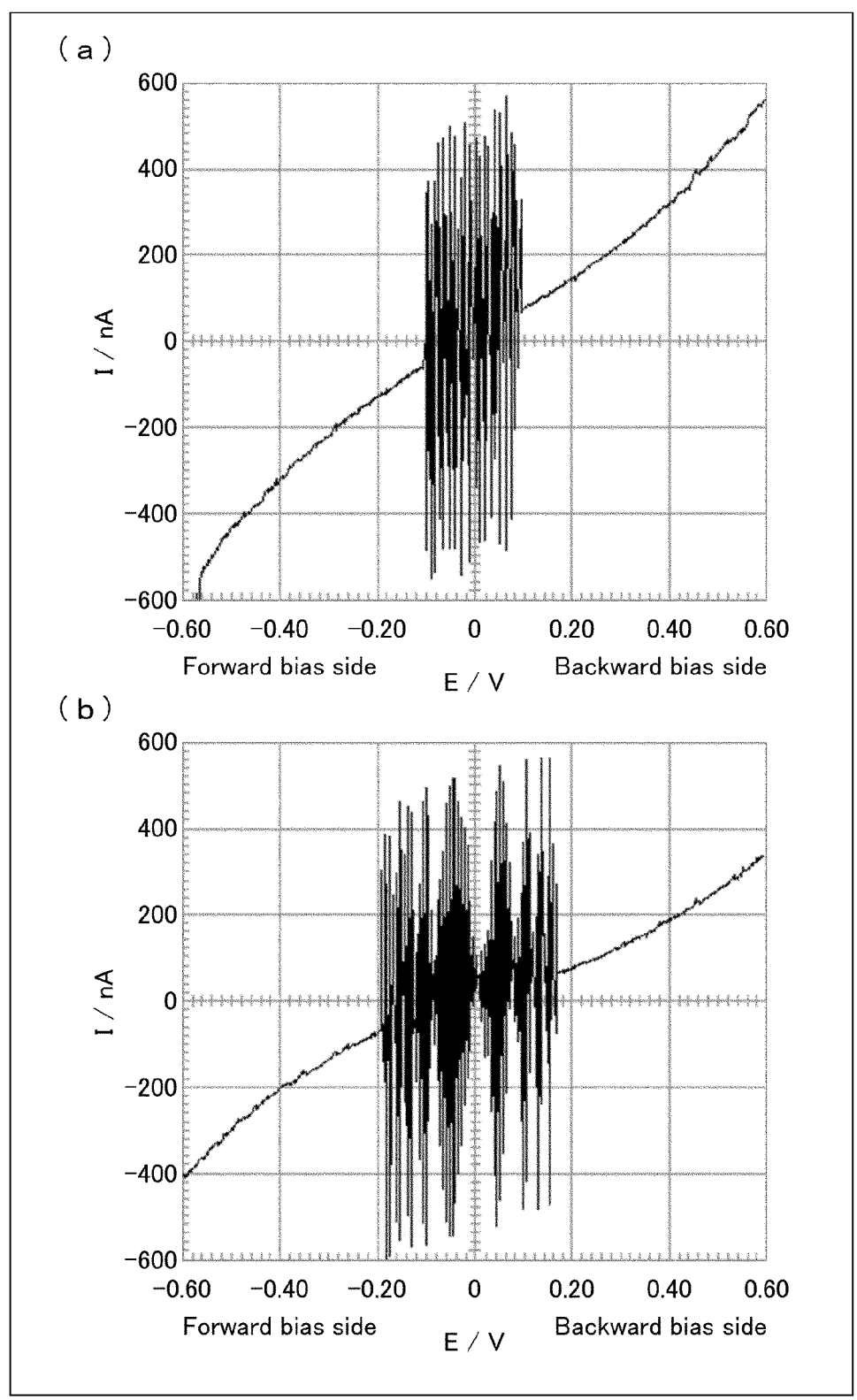

(a) and (b) of FIG. 24 are each a graph showing a result of measurement of an I-V characteristic during oscillation.

Figure 25:
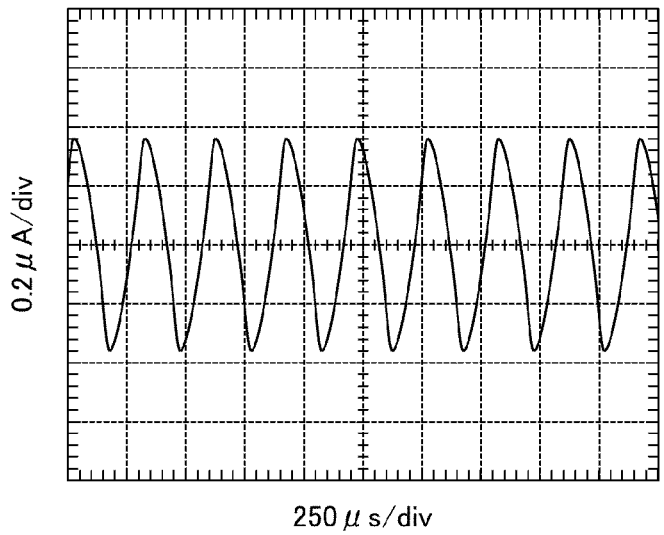

FIG. 25 is graph showing an electric current waveform measured during oscillation.

Figure 26:
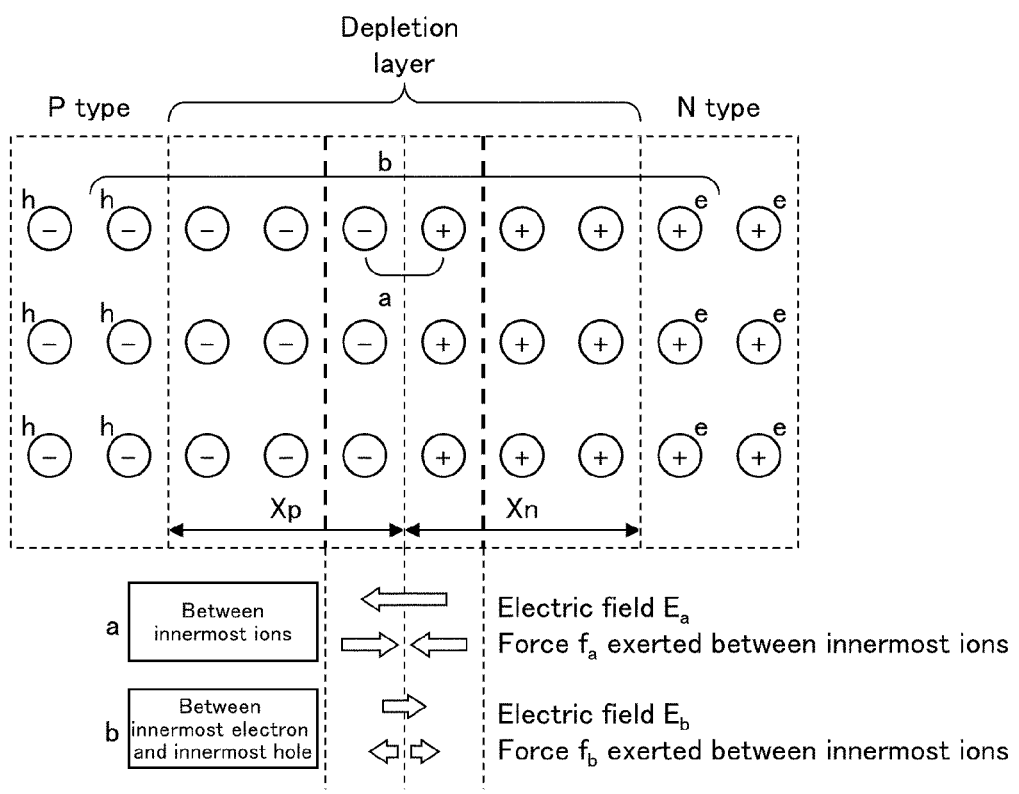

FIG. 26 is a view schematically illustrating a state of an electric field in a depletion layer at low carrier concentration.

Figure 27:
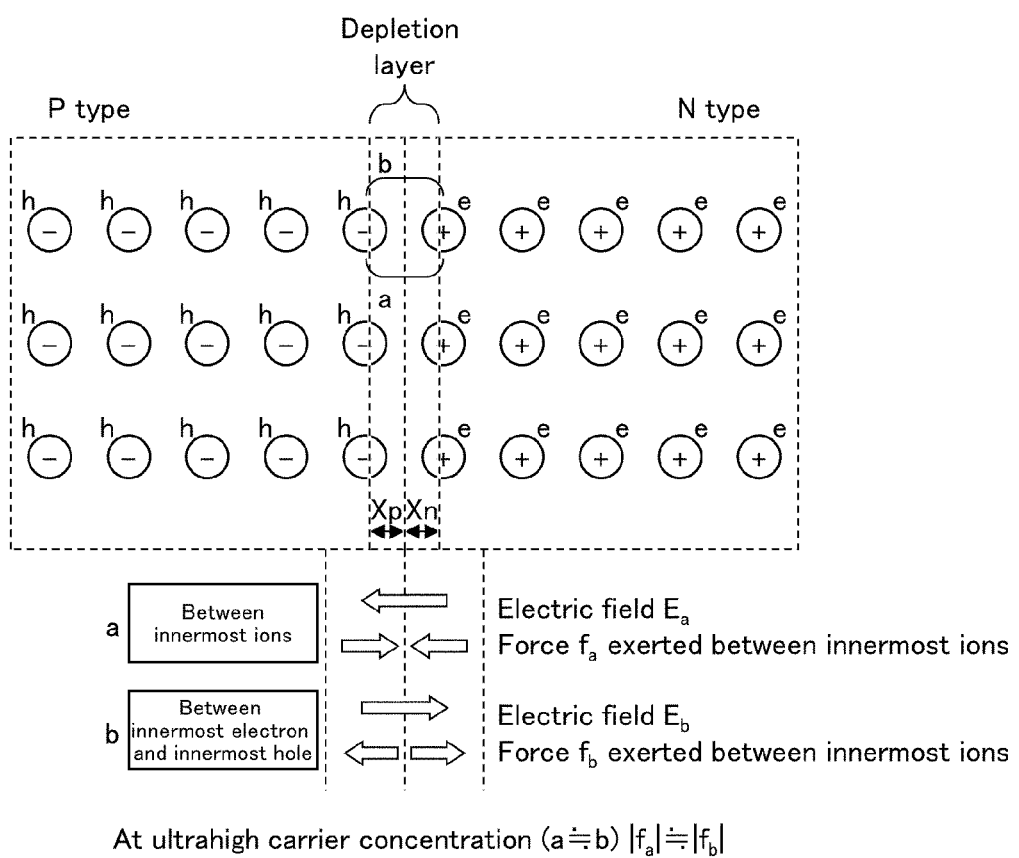

FIG. 27 is a view schematically illustrating a state of an electric field in a depletion layer at high carrier concentration.

Figure 28:
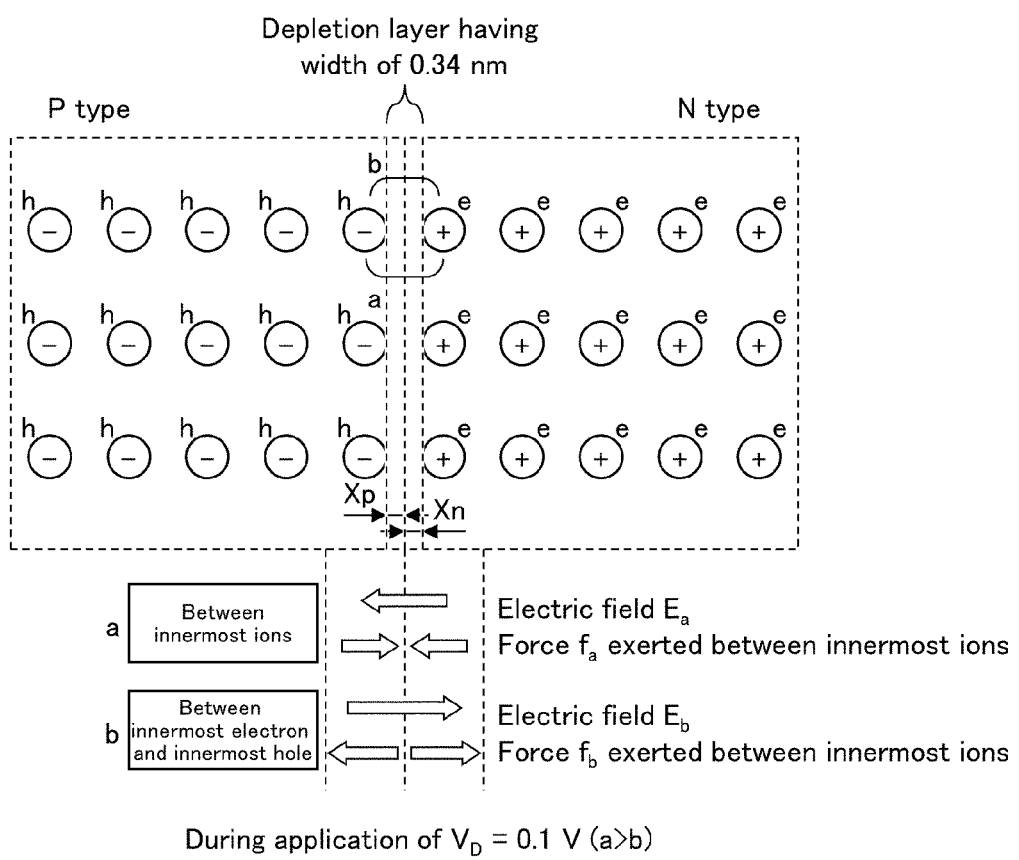

FIG. 28 is a view schematically illustrating a force that is exerted between innermost ions at high carrier concentration.

Figure 29:
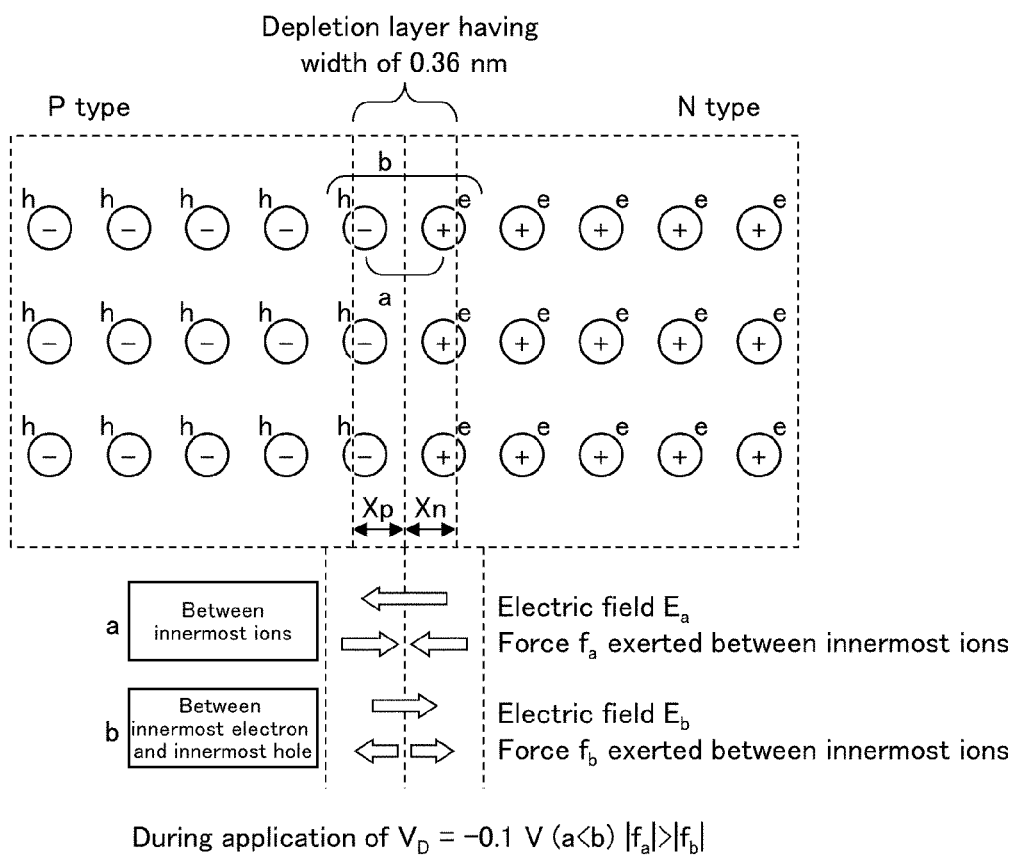

FIG. 29 is a view schematically illustrating a force that is exerted between innermost ions at high carrier concentration.

DESCRIPTION OF EMBODIMENTS

[Material]

A film for forming a semiconductor layer by a spark method can be made of any material provided that the material is (i) a metallic compound that is more powerful in ionic bonding property than in covalent bonding property and (ii) an insulator or a substance whose electric conductivity is extremely low. The material can be, for example, a metal oxide such as an aluminum oxide or a titanium oxide, a metal hydroxide such as an aluminum hydroxide, or a metal nitride such as an aluminum nitride. The material can alternatively be a compound (e.g., boehmite) in which an aluminum oxide contains a water molecule.

Note that a metal ion contained in the film for forming a semiconductor layer by a spark method and a metal of which a substrate of the film is made can be different in kind. The film for forming a semiconductor layer by a spark method can be, for example, a film obtained by forming a zirconium oxide on metallic aluminum by sputtering, or a film formed on a surface of metallic aluminum by chemical treatment.

In a case where the substrate is made of metallic aluminum, the metallic aluminum can be an aluminum alloy. Specifically, examples of the metallic aluminum include not only high-purity aluminum of not less than 4 N and pure aluminum (1000 series) but also an Al-Mn-based alloy (3000 series), an Al-Si-based alloy (4000 series), an Al-Mg-based alloy (5000 series), an Al-Cu-Mg-based alloy (2000 series), an Al-Mg-Si-based alloy (6000 series), and an Al-Zn-Mg-based alloy (7000 series).

In a case where the film is made of a metal oxide, the metal oxide is a transparent oxide in many cases. In a case where such a metal oxide is made into a semiconductor by a spark method but the semiconductor has a wide band gap, the semiconductor absorbs no energy in a visible light region. This causes the semiconductor to be a transparent oxide semiconductor.

A probe material for sparking such a film material (described earlier) by bringing the probe material into contact with the film material can be a highly electrically conductive substance such as platinum, stainless steel, copper, or carbon. The probe material, which reaches a high temperature due to a spark, is preferably a material that is highly resistant to heat. Platinum is an excellent material but is high in cost. The probe material can be, for example, a material obtained by plating an outermost surface of a core of Si with platinum.

Embodiment 1

Embodiment 1 of the present invention is described below with reference to FIGS. 1 to 17. Note that identical parts are given respective identical reference signs in the embodiments and parts that are given respective identical reference signs in the drawings are not repeatedly described as appropriate. Note that dimensions, materials, shapes, relative arrangements, processing methods, and the like of the configurations described in the embodiments are mere examples and should not be construed as limiting the technical scope of the present invention. Furthermore, the drawings, which are schematic, do not necessarily show actual dimensional ratios and actual shapes.

<Semiconductor Layer>

The following description discusses a semiconductor layer in accordance with Embodiment 1. The semiconductor layer in accordance with Embodiment 1 is formed by a method of sparking an aluminum oxide film. An example of how the semiconductor layer in accordance with Embodiment 1 is formed by that method is shown below.

(Sample and Apparatus)

Figure 1:
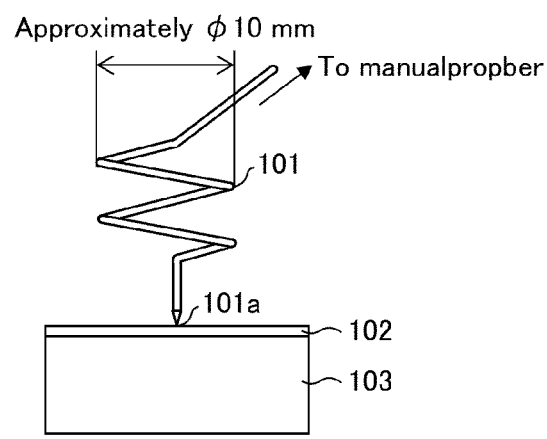
FIG. 1 is a view schematically illustrating a shape of a probe and a positional relationship between the probe and a sample.

As illustrated in FIG. 1, a sample obtained by covering a surface of metallic aluminum 103 with an aluminum oxide film 102 is prepared. In a naturally oxidized film, current flow points each of which has a diameter of approximately 100 nm are present so as to be dispersed. Thus, in a case where a high voltage is applied to a sample obtained by bringing a probe 101 into contact with the naturally oxidized film, a short-circuit electric current flows through the current flow points. Thus, even in a case where a high voltage is applied to the sample, no spark occurs. This makes it impossible to form a semiconductor layer. Under the circumstances, the surface of the metallic aluminum 103 is covered with the aluminum oxide film 102 in advance. Examples of a method by which to cover the surface of the metallic aluminum 103 with the aluminum oxide film 102 include a sputtering method, an anode oxidation method, an atmosphere heating method, and a boehmite treatment method. Note that the aluminum oxide film 102 with which the metallic aluminum 103 has been covered may contain water and is not necessarily a pure aluminum oxide. For example, a molecular formula of boehmite is $Al_2O_3 \cdot H_2O$ and contains one water molecule. The aluminum oxide film 102 has a thickness of 5 nm to 100 nm.

Next, a manual prober 20 was prepared and the probe 101 that had a configuration illustrated in FIG. 1 was attached to the manual prober 20. According to the probe 101, a probe tip 101a of a platinum wire (H material) having a diameter of 0.2 mm was sharpened so that a contact surface of the probe tip 101a with the sample had a diameter of 0.02 mm. The probe has a loop in coil form. This allows a tip of the probe to be in contact with the sample at a low pressure by a spring action.

Figure 2:
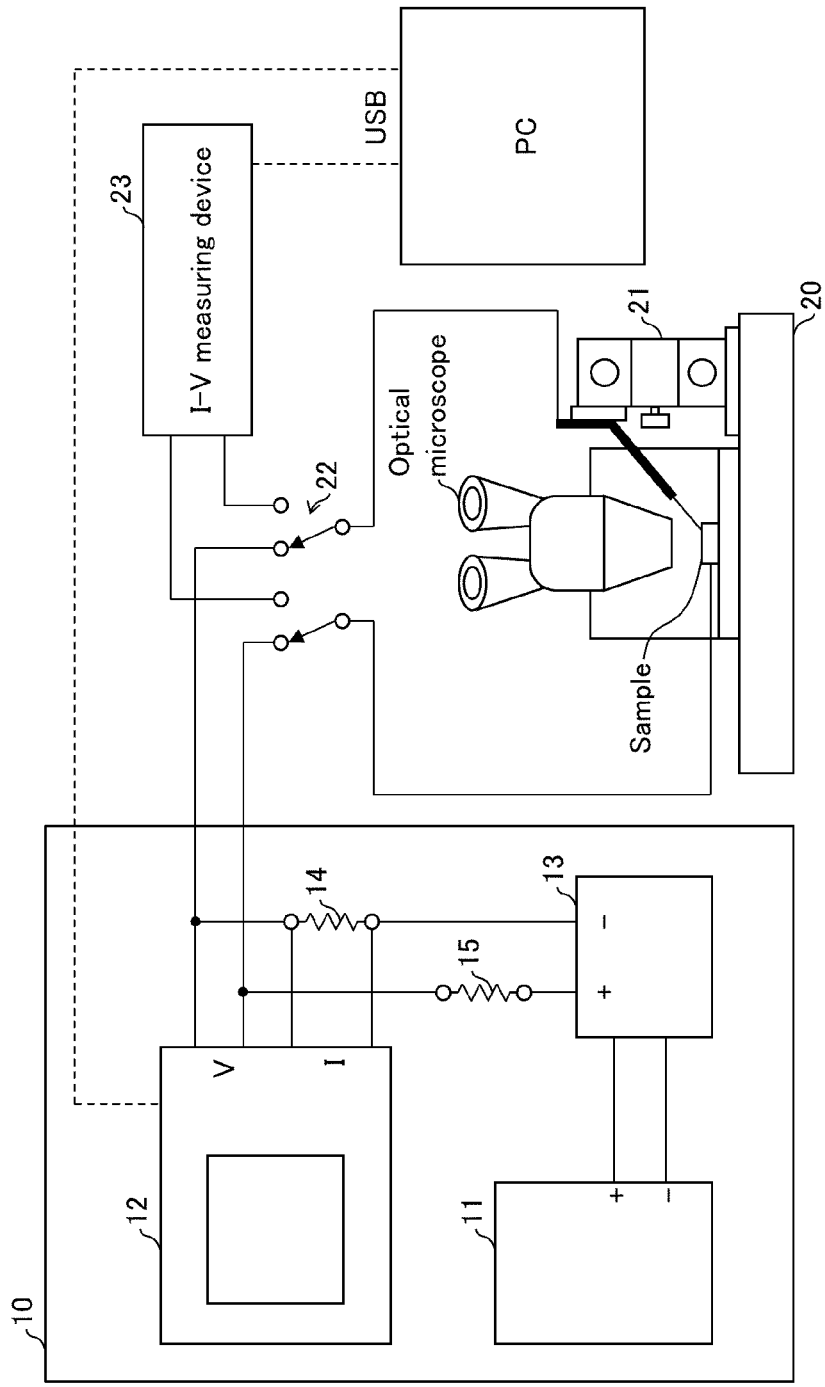
FIG. 2 is a view schematically illustrating an overall configuration of a measuring device.

An apparatus 10 illustrated in FIG. 2 was prepared, and a voltage was applied to the sample so that an I-V characteristic of the sample was measured. The probe tip was brought into contact with the aluminum oxide film, a voltage was applied between the metallic aluminum and the probe, so that a dielectric breakdown was caused by a spark. An applied voltage that is supplied from a stabilized direct current power supply 11 is variable. In FIG. 2, a metallic aluminum side is an anode (positive). The metallic aluminum side can be a cathode (negative) by reversing a polarity of the stabilized direct current power supply. As illustrated in FIG. 2, a switch box 13 (in which a reed relay is provided) has (i) a positive side that is connected, via an electric current limiting resistor 15, to the metallic aluminum side that is attached to the manual prober 20 and (ii) a negative side that is connected to the probe via a shunt resistor 14 for electric current measurement. Turning-on/off of a switch 22 connects the metallic aluminum side and the probe to an I-V measuring device 23 so that an I-V characteristic of the sample is measured. A voltage applied to the sample and an electric current flowing to the sample were measured with use of a high-voltage floating input oscilloscope 12.

A 1085 material (12 mm×30 mm, 20 μm in thickness) was used as the metallic aluminum to carry out a boehmite treatment with respect to a surface of the sample. The boehmite treatment was carried out by dipping the sample in pure water at 95° C. for 30 s, washing the sample in water, and drying the sample. A boehmite-treated film, which is insulative, was removed by partially filing the sample away, so that the sample could be electrically conducted. The probe illustrated in FIG. 1 was used, the sample was set on the manual prober 20 illustrated in FIG. 2, and a tip of the prober was positionally adjusted with use of a manipulator 21 so as to bring the tip into contact with a boehmite-treated film. A force of approximately 0.01 N applied to the probe tip was applied to the boehmite-treated film.

(Electric Conduction)

Figure 3:
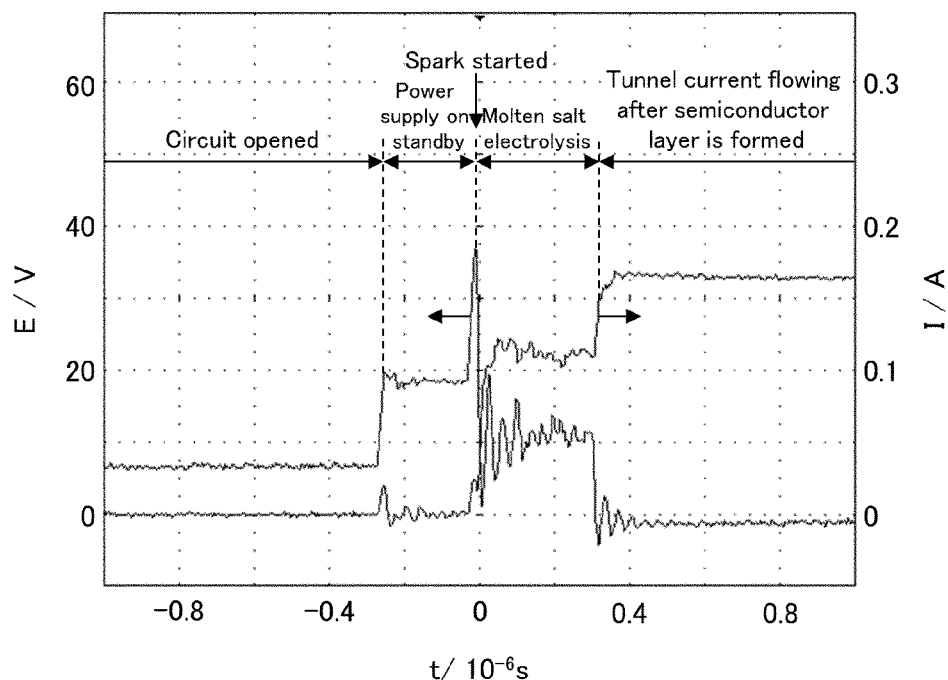
FIG. 3 is a graph showing a voltage and an electric current characteristic each measured in a case where an aluminum oxide film is sparked.

In FIG. 2, the electric current limiting resistor 15 was set to 100Ω, the shunt resistor 14 was set to 100Ω, an output of a direct current stabilizing power supply was set to 36 V, and a switch of the switch box 13 was closed. A spark was carried out between the probe tip and the metallic aluminum. In a part with which the probe tip had been brought into contact, a semiconductor layer having a thickness of approximately 30 nm was formed. A voltage applied to the sample in this case and an electric current flowing to the sample in this case were measured with use of the oscilloscope 12. A result of this is shown in FIG. 3.

The switch was closed at −0.28 μs, but a trigger occurred under a condition that an electric current value actually exceeded 0.05 A. Thus, a point in time at which the trigger occurred was set to 0 μs. Since a widely-used direct-current power supply was used, the power supply was in a standby state during a period from −0.28 μs to 0 μs. Thus, during this period, an output of the power supply did not reach 36 V, which was set as an output of the widely-used direct-current power supply, and a voltage of approximately 20 V was outputted. At a voltage of 20 V, no spark occurred, and little electric current flowed to the sample.

A voltage of 36 V was momentarily applied to the sample at 0 μs, but the voltage decreased to approximately 10 V as soon as an electric current caused by a spark flowed to the sample. An electric current value was approximately 0.1 A. This state continued for 0.3 μs. It is considered that a spark continued during this period, and the film reached a high temperature, reached a molten state, and was made thick. Furthermore, there is a great fluctuation in voltage during this period. Note, however, that it is unclear whether the great fluctuation is due to a transient phenomenon that was caused by reactance such as inductance of the device when the switch was closed or due to a material inherent characteristic. After 0.3 μs had passed, the voltage decreased to approximately 0 V, and the electric current increased to 0.17 A. FIG. 3 shows a state that arose until 1 μs elapsed. Thereafter, this state was maintained. Note, however, that neither the electric current nor the voltage changed until 60 s elapsed. It is considered that a tunnel current or an electric current caused by a metallized electron state of the film flowed to the semiconductor layer at and after 0.3 μs. The reason for this will be described later. After electric conduction was finished, a state of the probe was maintained as it was, and a connection of the switch 22 of FIG. 2 was switched to the right side, i.e., I-V measurement.

(Result of I-V Measurement)

Figure 4:
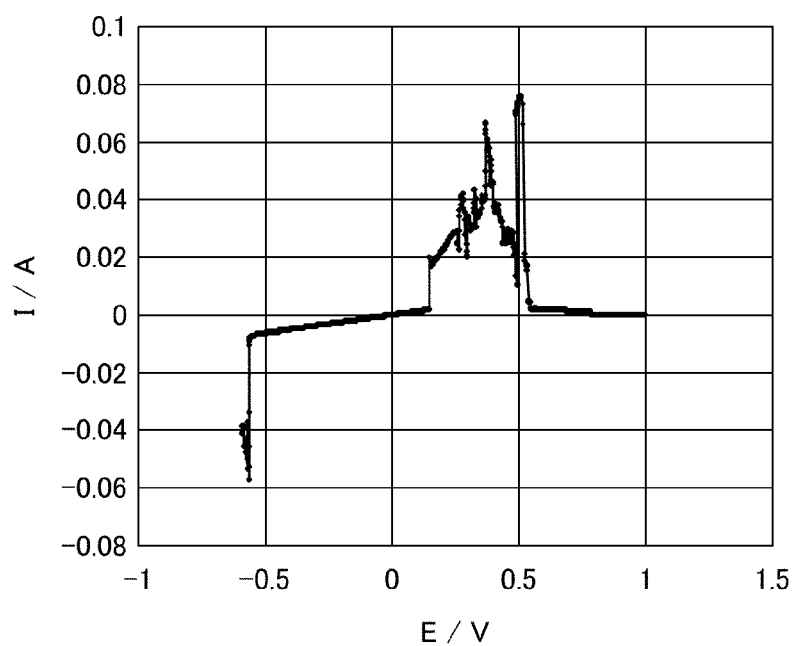
FIG. 4 is a graph showing a result of measurement of an I-V characteristic.

The semiconductor layer thus obtained was subjected to I-V measurement. A result of this is shown in FIG. 4. Scanning was carried out while a voltage was continuously changed in a range of −0.6 V to 1.0 V at a velocity of 0.1 V/s. A substantially linear relationship was obtained in a voltage range of −0.55 V to +0.2 V. It is considered that a tunnel current or an electric current caused by a metallized electron state of the film flowed between the metallic aluminum and the probe in this voltage range. At a voltage of not more than −0.55 V and in a voltage range of +0.2 V to +0.55 V, a current-voltage relationship deviated from the linear relationship, so that a large electric current flowed. In a voltage range of +0.55 V to +1.0 V, little electric current flowed. It is currently unclear why the current-voltage relationship deviates from the linear relationship in such a wide voltage range. However, it is considered that a carrier behavior of the semiconductor layer is in an unstable state. In a case where a short circuit occurs between the metallic aluminum and the probe, the linear relationship should be obtained in an entire voltage region of the I-V characteristic. As long as the linear relationship is not obtained in the entire voltage region, the linear relationship obtained in the voltage range of −0.55 V to +0.2 V can be said to be a characteristic unique to the semiconductor layer formed.

Figure 5:
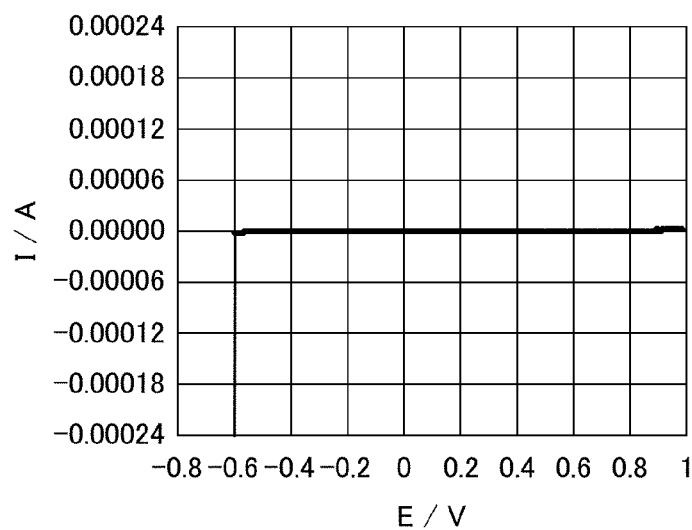
FIG. 5 is a graph showing a result of measurement of an I-V characteristic.

Next, the electric current limiting resistor 15 illustrated in FIG. 2 was changed from 100Ω to 1 kΩ, the probe tip was moved so as to be brought, in another place in the identical sample, into contact with the boehmite-treated film, and a spark was carried out by a method identical to the method described earlier, so that a semiconductor layer was formed. In this case, a voltage and an electric current of the sample were substantially identical in behavior to those of FIG. 3. Note, however, that time required for molten salt electrolysis decreased to approximately 30 ns, and the electric current decreased to approximately 0.03 A. Coulomb amount required for a molten salt electrolysis reaction was approximately 1/100 of that required in the example described earlier. Note here that FIG. 5 shows an I-V characteristic of the semiconductor layer formed. A negative electric current flowed at a voltage of not more than −0.6 V. In contrast, at a voltage of more than −0.6 V, no electric current flowed, and a so-called rectifying characteristic was displayed. A pn junction was formed in the semiconductor layer, so that the semiconductor layer had an n-type semiconductor on the metallic aluminum side and had a p-type semiconductor on the probe side.

Note that a "molten salt" was herein used in such a broad sense as below. Specifically, a movement (electrophoresis) caused by electrolysis of aluminum ions and oxygen ions can be achieved in not only a completely molten salt but also a solid-liquid mixture in which solid states are mixed. Under the circumstances, a salt in a solid-liquid mixed state was also expressed as a "molten salt".

It is found from the results of the above two examples (i) that a large quantity of electric conduction during molten salt electrolysis caused by a spark causes a semiconductor layer to have a high carrier concentration, and causes a depletion layer formed in a pn junction to have a small thickness, so that a tunnel current or an electric current caused by a metallized electron state of the film flows to the semiconductor layer and (ii) that a small quantity of electric conduction during molten salt electrolysis caused by a spark causes the semiconductor layer to have a low carrier concentration, and causes the depletion layer formed in the pn junction to have a large thickness.

According to the above description, a semiconductor layer is formed by sparking an aluminum oxide film under a condition that a metallic aluminum side is an anode (positive side) and a probe side is a cathode (negative side), and, consequently, the aluminum oxide film has an n-type semiconductor on the metallic aluminum side and has a p-type semiconductor layer on the probe side.

The semiconductor layer can alternatively be formed by sparking the aluminum oxide film under a condition that the metallic aluminum side is the cathode (negative side) and the probe side is the anode (positive side). In this case, the aluminum oxide film has a p-type semiconductor on the metallic aluminum side and has an n-type semiconductor layer on the probe side.

(Estimation of Semiconductor Configuration by the Present Method)

(Element Constituting Semiconductor Layer)

As described earlier, a semiconductor layer in accordance with an embodiment of the present invention is formed by subjecting an aluminum oxide film to dielectric breakdown by a spark. A configuration of a semiconductor layer formed by a spark was determined by capturing an image of a cross section of the semiconductor layer with use of a transmission electron microscope (TEM) and carrying out EDS analysis (elementary analysis). In capturing the image with use of the TEM, a sample was prepared by using a focused ion beam (FIB) to cause the cross section of the semiconductor layer to be a thin film.

Figure 6:
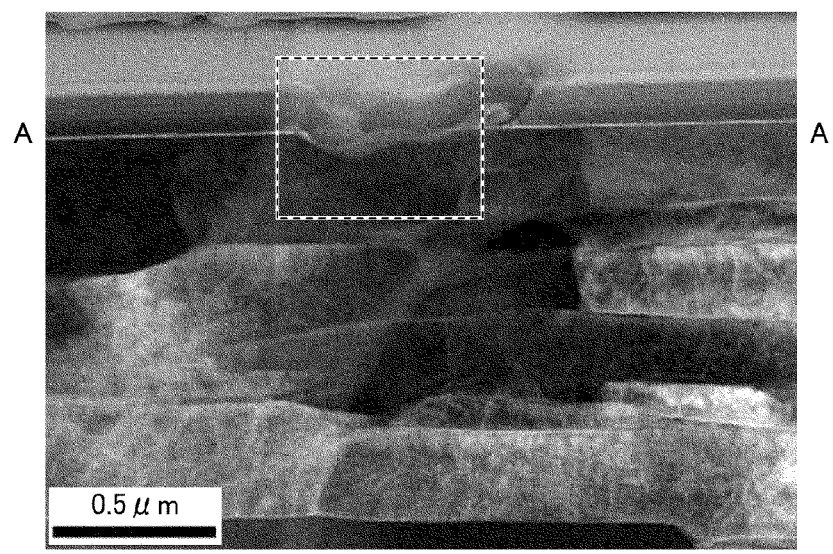
FIG. 6 shows a result of TEM observation carried out with respect to a cross section of a semiconductor layer.

FIG. 6 shows a captured image of the sample. As shown in FIG. 6, AA indicates a line of a naturally oxidized film of metallic aluminum, a region below the line indicates a metallographic structure of the metallic aluminum, and a region above the line indicates a filler used to prepare a TEM observation sample. A central part of a dotted box indicates a semiconductor layer. The metallic aluminum has a large hollow, and a layer that is located above the metallic aluminum so as to extend along the hollow is the semiconductor layer. The semiconductor layer has a thickness of 5 nm to 100 nm, and a probe tip is located above a part of the semiconductor layer which part has a largest thickness.

Figure 7:
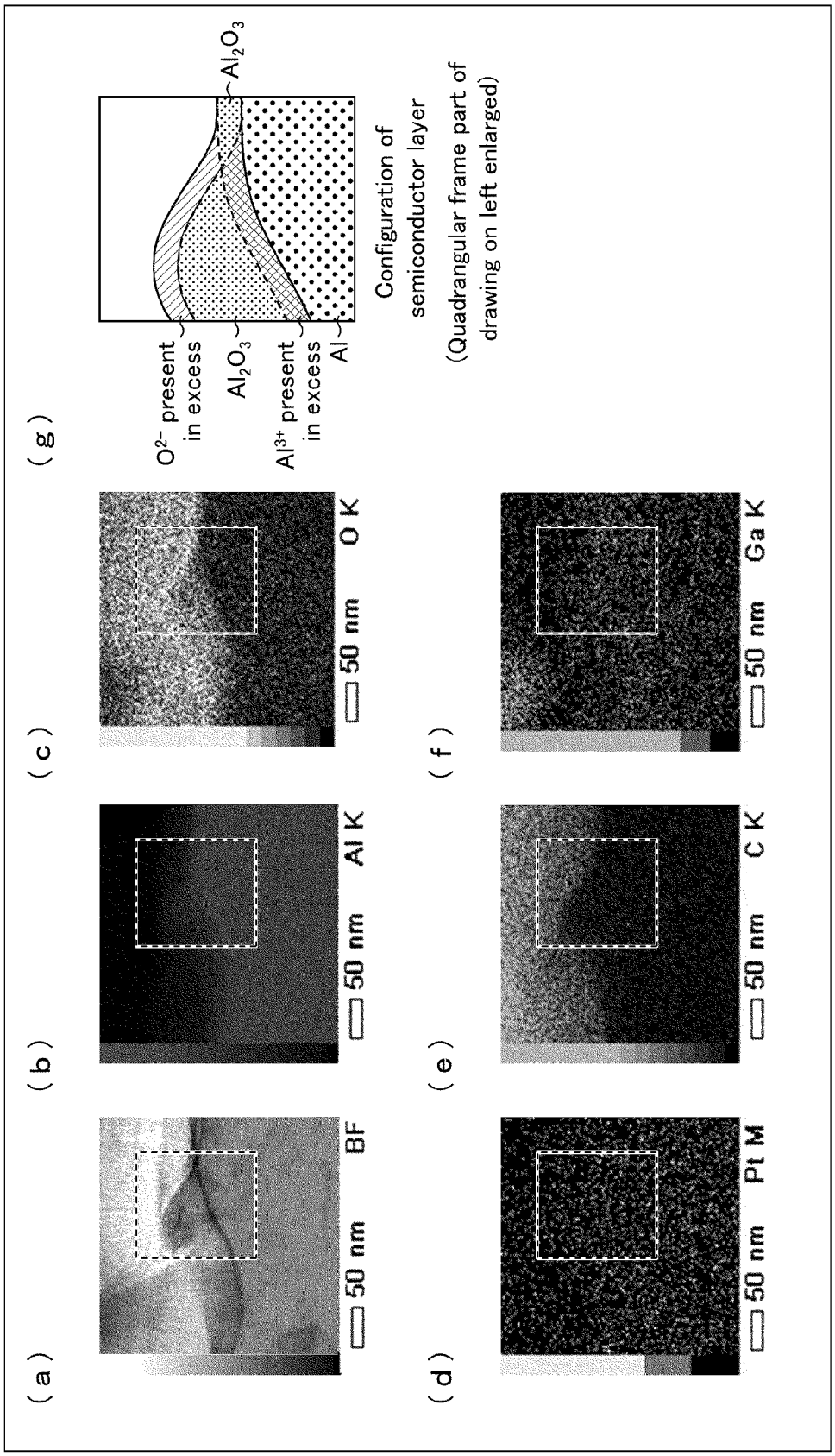
FIG. 7 shows a result of EDS analysis carried out with respect to a semiconductor layer.

FIG. 7 shows a result of EDS analysis of a thickest part and its vicinity of the semiconductor layer in the dotted box of FIG. 6. The semiconductor layer is located at a center of a bright field (BF) image, and the probe tip is located at a peak of a Mt. Fuji-like, i.e., flared part of an upper part of the semiconductor layer. A region below the semiconductor layer indicates the metallic aluminum, and a region above the semiconductor layer indicates the filler used to prepare the sample. The other five images of FIG. 7 show results of EDS analysis of Al, O, Pt, C, and Ga. The rightmost drawing of FIG. 7 is obtained by enlarging a quadrangular frame part of each of the results of EDS analysis and schematically illustrating substances constituting the semiconductor layer.

A close look at distribution of Al and O in the semiconductor layer shows that Al has a high concentration on a lower side, which is the metallic aluminum side, and O has a high concentration on an upper side, which is the filler side (atmosphere side before the semiconductor layer is used as an analysis sample). In a case where distribution of Al is observed in comparison with the BF image, it seems that a part in which Al is dense has a thickness of approximately 15 nm and extends along an Al metal surface so as to be belt-shaped. This part is considered to be a part in which $O^{2-}$ of $Al_2O_3$ is nonstoichiometrically depleted and $Al^{3+}$ is excessively present ($N^{++}$). In contrast, in a case where distribution of O is observed, a part in which O is dense has a thickness of approximately 15 nm and extends along a semiconductor layer film surface a so as to be belt-shaped. This part is considered to be a part in which $Al^{3+}$ of $Al_2O_3$ is nonstoichiometrically depleted and $O^{2-}$ is excessively present ($P^{++}$).

Figure 8:
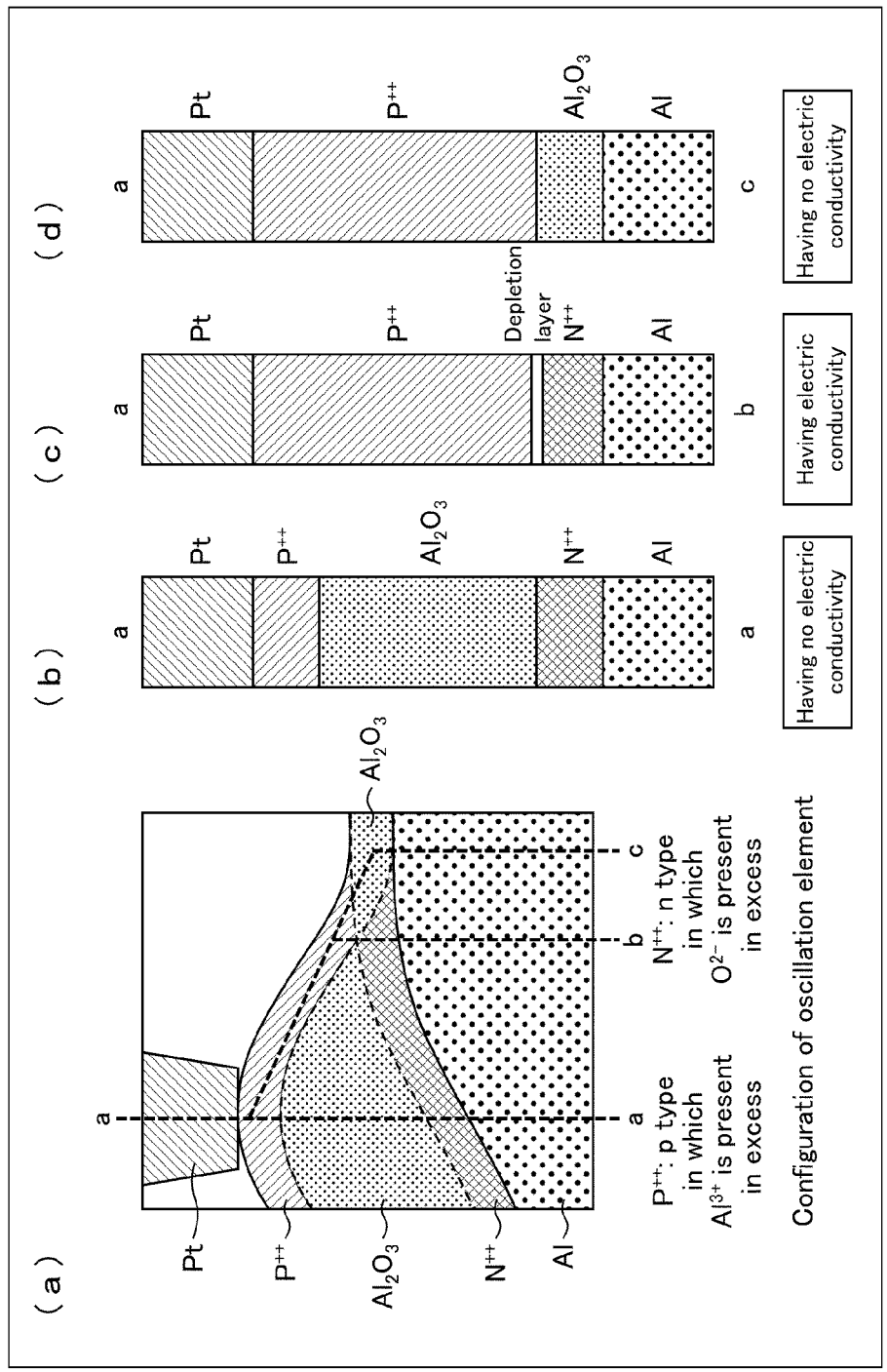
FIG. 8 is a view schematically illustrating an overall configuration of a semiconductor layer.

The drawing on the left in FIG. 8 is obtained by adding the probe tip (Pt) to the view of FIG. 7, which view schematically illustrates the configuration of the semiconductor layer. Three drawings on the right in FIG. 8 show that the configuration of the semiconductor layer is classified into three types according to a difference in path for an electric current that passes through the semiconductor layer. In an aa cross section including a thick part (having a thickness of approximately 70 nm) of the semiconductor layer, $Al_2O_3$ that has a stoichiometric composition or a nearly stoichiometric composition is considered to be present between $N^{++}$ (the part in which $Al^{3+}$ is excessively present) and $P^{++}$ (the part in which $O^{2-}$ is excessively present). The $Al_2O_3$ has no new energy level and thus is not electrically conductive. In an ab cross section, it is considered that a depletion layer is formed, as described later, in a part in which $N^{++}$ and $P^{++}$ are in proximity to each other, so that a pn junction is formed. Furthermore, in an ac cross section, $N^{++}$ and $P^{++}$ are considered to be mixed so as to cross each other. It is considered that the part in which $Al^{3+}$ is excessively present and the part in which $O^{2-}$ is excessively present cause an ionic bond, so that $Al_2O_3$ that has a stoichiometric composition or a nearly stoichiometric composition is present. Thus, as in the case of the aa cross section, the ac cross section is not electrically conductive.

A result of the above elementary analysis shows (i) that the semiconductor layer formed by a spark method is an aluminum oxide film but has a highly specific structure in which Al and O are segregated to the metallic aluminum side and the semiconductor layer surface, respectively, and (ii) that the pn junction is present in an extremely limited part.

In a case where a semiconductor layer is formed by a spark method of an aspect of the present invention, the ab cross section has a small area, but the semiconductor layer is always present in a part in which $P^{++}$ and $N^{++}$ cross each other. Thus, the spark method is a production method that is highly reproducible.

A semiconductor layer obtained by an embodiment of the present invention is considered to have an amorphous structure. This is because, since a time for which an aluminum oxide layer is melted by a spark and then cooled and solidified is extremely short, the aluminum oxide layer is less likely to be crystallized. According to a covalent bonding semiconductor such as an Si semiconductor, a size of a bond has direction dependency. Thus, in a case where the covalent bonding semiconductor is not crystalline, it is impossible to obtain a carrier conducting pathway. In contrast, according to a semiconductor that has a powerful ionic bonding property, such as aluminum oxide, a size of a bond has no direction dependency. Thus, even in a case where the semiconductor is amorphous, it is possible to achieve a carrier conducting pathway. With this, also in a case where a semiconductor layer has an amorphous structure, it is possible to obtain a semiconductor characteristic.

(Estimation of Process for Forming Semiconductor Layer)

(In Case of Spark Carried Out Under Condition that Metallic Aluminum is Positive and Probe is Negative)

The reason why a semiconductor layer that has such a highly specific elemental structure is obtained was estimated.

First, the following description discusses a case where a spark is carried out under a condition that metallic aluminum is positive and a probe is negative.

Figure 9:
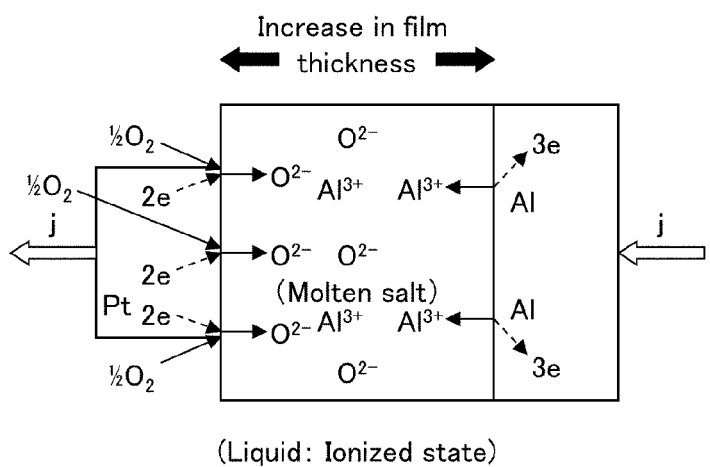
FIG. 9 is a view schematically illustrating a reaction that occurs in a semiconductor layer that is melted at a high temperature by a spark under a condition that metallic aluminum is an anode and a probe is a cathode.

FIG. 9 illustrates a state in which an aluminum oxide film, which is an insulator, is melted by a spark. During the spark, a spark electric current flows for a short time as illustrated in FIG. 3. During this period, the aluminum oxide film reaches a high temperature not lower than a melting point so as to be a molten salt. The aluminum oxide film has a melting point of 2072° C. Molten salt electrolysis occurs at a temperature not lower than a melting point in accordance with formulas (1) and (2), and $Al^{3+}$ and $O^{2-}$ accumulate as represented by a formula (3), so that a thick semiconductor layer is obtained.

Anode reaction (Al metal side) $Al \rightarrow Al^{3+} + 3e$ (1)

Cathode reaction (probe side) $O_2 + 4e \rightarrow 2O^{2-}$ (2)

Overall reaction $4Al + 3O_2 \rightarrow 4Al^{3+} + 6O^{2-}$ (3)

Figure 10:
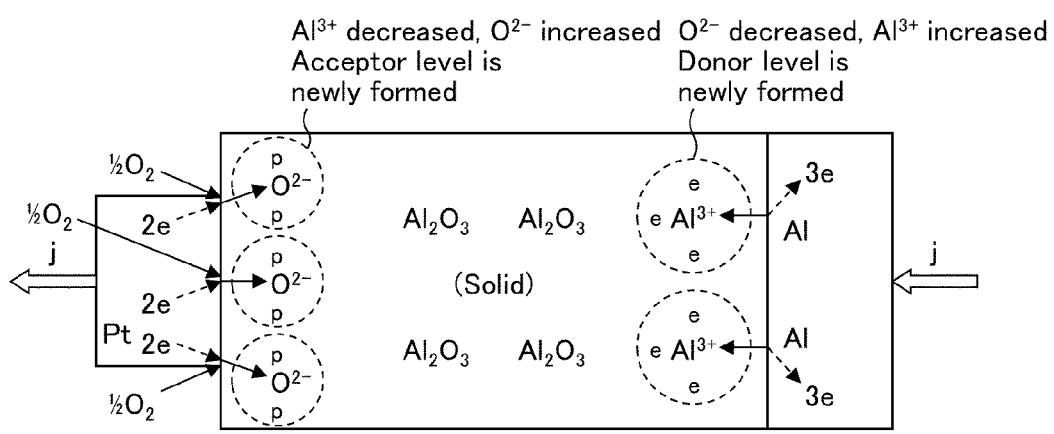
FIG. 10 is a view schematically illustrating a reaction that occurs in the semiconductor layer of FIG. 9, the semiconductor layer having a temperature that has dropped to a temperature that is slightly lower than a melting point.

In a case where the spark is finished, the temperature decreases. Note, however, that a rate of decrease in temperature is not perfectly uniform in the semiconductor layer. A solid and a liquid are mixed and partially solidified, so that $Al_2O_3$ is formed. For (i) the reason that a part that remains molten is still ionized or (ii) the reason that $Al_2O_3$, which is a solid, is an insulator at a room temperature but has electronic conductivity at a high temperature close to a melting point, or for both the reasons (i) and (ii), the above anode reaction and the above cathode reaction continue to occur as illustrated in FIG. 10. On the metallic aluminum side of the semiconductor layer, $Al^{3+}$ ions are in excess, but a new donor level is formed in the semiconductor layer so that electroneutrality is maintained. In contrast, on the probe side of the semiconductor layer, $O^{2-}$ ions are in excess, but a new acceptor level is formed in the semiconductor layer so that electroneutrality is maintained.

Figure 11:
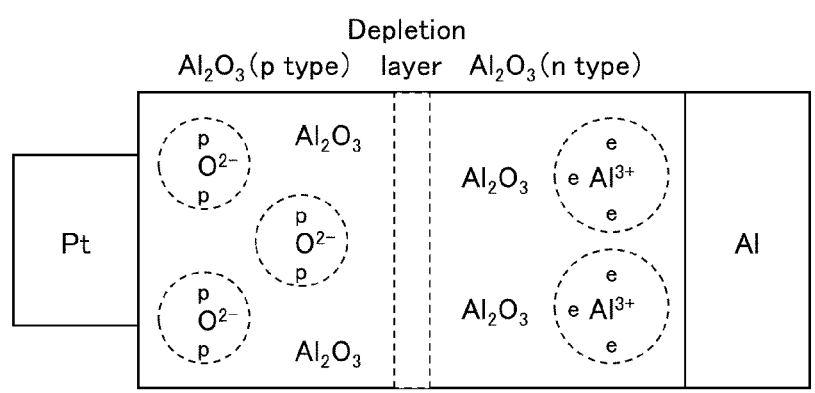
FIG. 11 is a view schematically illustrating a configuration of the semiconductor layer of FIG. 10, the semiconductor layer having a temperature that has dropped to a room temperature.

In a case where the temperature further decreases to the room temperature, a semiconductor layer that has a configuration illustrated in FIG. 11 is considered to be formed. The semiconductor layer (i) has, on the metallic aluminum side, an n-type semiconductor that has an excessive Al concentration and (ii) has, on the probe side (Pt side), a p-type semiconductor that has an excessive O concentration. The n-type semiconductor and the p-type semiconductor make a pn junction, and a depletion layer is formed in a part in which n-type semiconductor and the p-type semiconductor are joined. A thickness of the depletion layer is determined by respective carrier concentrations of the donor level and the acceptor level, each having been newly formed. From, for example, a result of EDS analysis of a cross section of the semiconductor layer, a maximum value of a carrier concentration is estimated to be an extremely high concentration ($10^{27}$ to $10^{29}/m^3$), and the depletion layer has a thickness of not more than 1 nm, so that a tunnel current easily flows. Alternatively, it is considered that an extremely high carrier concentration metallizes a film electronic state, so that high electric conductivity is obtained.

Figure 12:
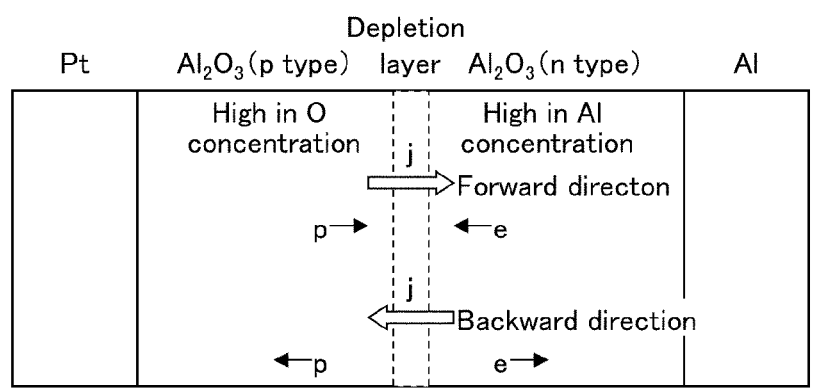
FIG. 12 is a view schematically illustrating a configuration of a pn junction diode that is formed by a spark under a condition that metallic aluminum is an anode and a probe is a cathode.

FIG. 12 shows an example of a pn junction diode that is formed by a spark under a condition that metallic aluminum is an anode and a probe is a cathode.

Figure 13:
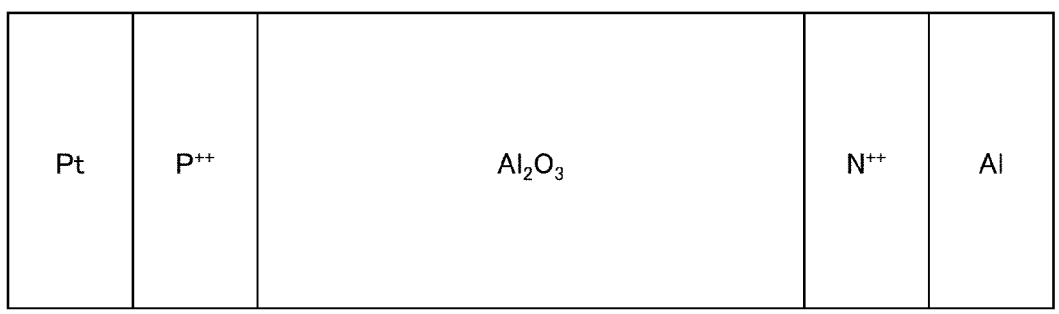
FIG. 13 is a view schematically illustrating a configuration of a pn junction that is included in the semiconductor layer of FIG. 8.
Figure 13:
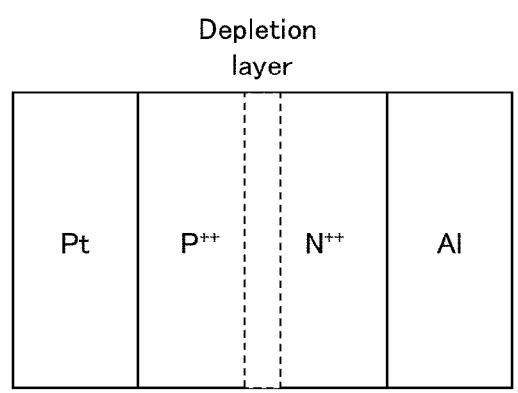
Figure 13:
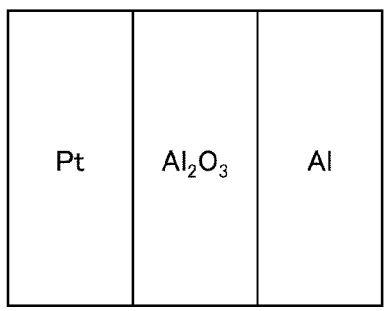

It is estimated that a pn junction diode is formed by the above mechanism. Note, however, that a part in which a pn junction is actually formed by a spark method is considered to have a small area. FIG. 13 is obtained by rotating 90° the semiconductor configurations in aa, ab, and ac each illustrated in FIG. 8. In the aa, an $Al_2O_3$ layer is present in the middle thereof. It is considered that this part has a low carrier concentration and is not electrically conductive or is hardly electrically conductive. The ab is in a state in which the pn junction (described earlier) is formed. In the ac, it is considered that a part in which $Al^{3+}$ is in excess and a part in which $O^{2-}$ is in excess are mixed and react with each other so as to form an ionic bond, so that $Al_2O_3$ is formed. As in the case of the aa, it is considered that this part has a low carrier concentration and is not electrically conductive or is hardly electrically conductive. An actual semiconductor device is estimated to operate in the ab part.

(In Case of Spark Carried Out Under Condition that Metallic Aluminum is Negative and Probe is Positive)

Next, the following description discusses a case where a spark is carried out under a condition that metallic aluminum is negative and a probe is positive.

Figure 14:
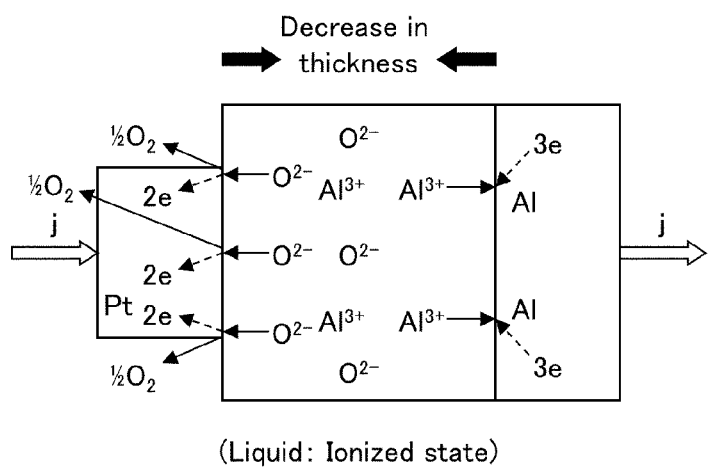
FIG. 14 is a view schematically illustrating a reaction that occurs in a semiconductor layer that is melted at a high temperature by a spark under a condition that metallic aluminum is a cathode and a probe is an anode.

FIG. 14 illustrates a state in which an aluminum oxide film is on metallic aluminum so as to be thick enough for a spark to be carried out, and the aluminum oxide film, which is an insulator, is melted by the spark. During the spark, a spark electric current flows for a short time. During this period, the aluminum oxide film reaches a high temperature not lower than a melting point so as to be a molten salt. Molten salt electrolysis occurs at a temperature not lower than a melting point in accordance with formulas (4) and (5), and $Al^{3+}$ and $O^{2-}$ are consumed, as represented by a formula (6), so as to be metallic aluminum and oxygen, respectively, so that a thin semiconductor layer is obtained.

Cathode reaction (metallic aluminum side) $Al^{3+} + 3e \rightarrow Al$ (4)

Anode reaction (probe side) $2O^{2-} \rightarrow O_2 + 4e$ (5)

Overall reaction $4Al^{3+} + 6O^{2-} \rightarrow 4Al + 3O_2$ (6)

Figure 15:
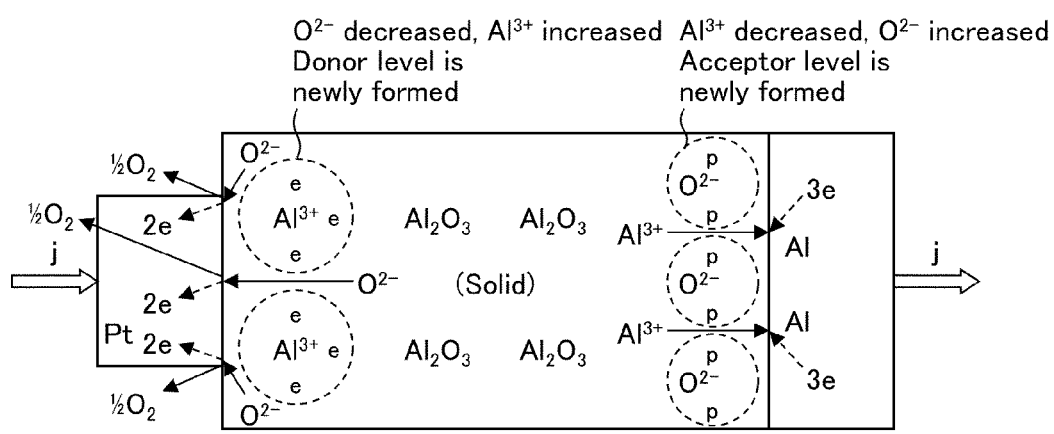
FIG. 15 is a view schematically illustrating a reaction that occurs in the semiconductor layer of FIG. 14, the semiconductor layer having a temperature that has dropped to a temperature that is slightly lower than a melting point.

In a case where the spark is finished, the temperature decreases. Note, however, that a rate of decrease in temperature is not perfectly uniform in the semiconductor layer. A solid and a liquid are mixed and partially solidified, so that $Al_2O_3$ is formed. For (i) the reason that a part that remains molten is still ionized or (ii) the reason that $Al_2O_3$, which is a solid, is an insulator at a room temperature but has electronic conductivity at a high temperature close to a melting point, or for both the reasons (i) and (ii), the above cathode reaction and the above anode reaction continue to occur as illustrated in FIG. 15. On the metallic aluminum side of the semiconductor layer, $O^{2-}$ ions are in excess, but a new acceptor electric potential is formed in the semiconductor layer so that electroneutrality is maintained. In contrast, on the probe side of the semiconductor layer, $Al^{3+}$ ions are in excess, but a new donor level is formed in the semiconductor layer so that electroneutrality is maintained.

Figure 16:
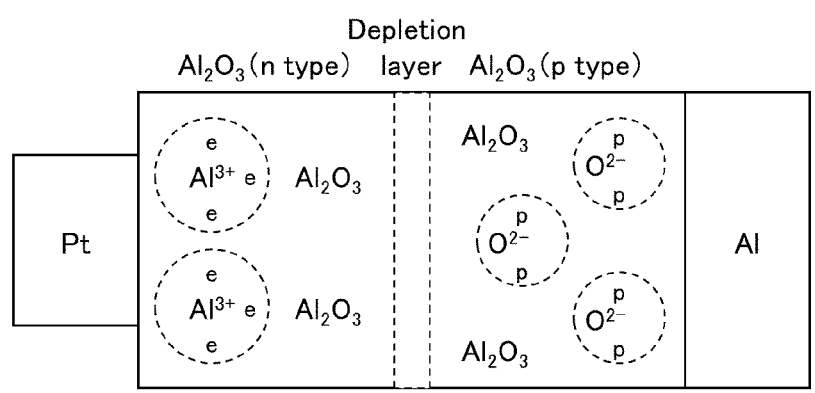
FIG. 16 is a view schematically illustrating a configuration of the semiconductor layer of FIG. 15, the semiconductor layer having a temperature that has dropped to a room temperature.

In a case where the temperature further decreases to the room temperature, a semiconductor layer that has a configuration illustrated in FIG. 16 is considered to be formed. The semiconductor layer (i) has, on the metallic aluminum side, a p-type semiconductor that has an excessive oxygen (O) concentration and (ii) has, on the probe side (Pt side), an n-type semiconductor that has an excessive Al concentration. The n-type semiconductor and the p-type semiconductor make a pn junction, and a depletion layer is formed in a part in which n-type semiconductor and the p-type semiconductor are joined. A thickness of the depletion layer is determined by respective carrier concentrations of the donor level and the acceptor level, each having been newly formed. A maximum value of a carrier concentration of the semiconductor layer is estimated to be an extremely high concentration ($10^{27}$ to $10^{29}/m^3$), and the depletion layer has a thickness of not more than 1 nm, so that a tunnel current easily flows. Alternatively, it is considered that an extremely high carrier concentration metallizes a film electronic state, so that high electric conductivity is obtained.

Figure 17:
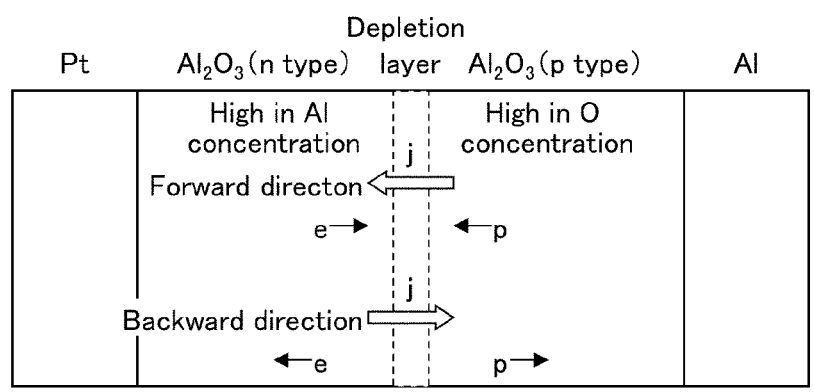
FIG. 17 is a view schematically illustrating a configuration of a pn junction diode that is formed by a spark under a condition that metallic aluminum is a cathode and a probe is an anode.

FIG. 17 shows an example of a pn junction diode that is formed by a spark under a condition that metallic aluminum is a cathode and a probe is an anode. A description of a cross section of a semiconductor layer is omitted.

Embodiment 2

(Scale-Up of Semiconductor Layer by Scanning Method)

Figure 18:
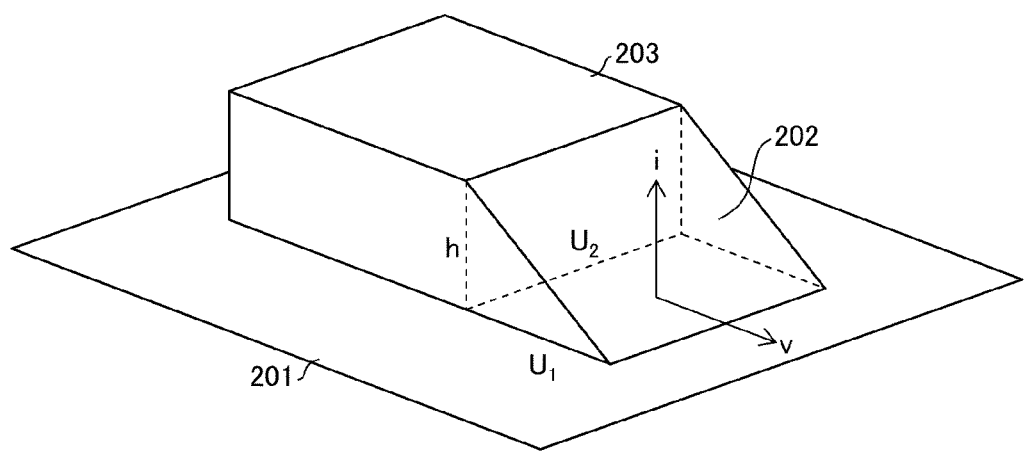
FIG. 18 is a view illustrating a method for generating an aluminum oxide film while scanning the aluminum oxide film with a probe tip.

Embodiment 2 of the present invention is described below with reference to FIGS. 18 to 20.

(Object of Scanning)

In a case where a spark electric current is caused to flow between metallic aluminum and a probe, whose position is fixed, so that an aluminum oxide film that is formed on the metallic aluminum is brought into contact with the probe, a semiconductor layer to be formed or the aluminum oxide film to be decomposed has a diameter of approximately 1 μm to 2 μm, and it is difficult to make the semiconductor layer or the aluminum oxide film larger. In order to scale up a semiconductor layer, the inventor of the present invention considered that the semiconductor layer can have a larger area and a greater volume in a case where a probe that is brought into contact with an aluminum oxide film is moved while a spark electric current is caused to flow to the aluminum oxide film. The present method is hereinafter referred to as a "scanning method". The following description discusses (i) a relationship between (a) a semiconductor layer to be formed or an aluminum oxide film to be decomposed and (b) a quantity of spark electricity, which quantity is an accumulated value of the spark electric current having flowed to the aluminum oxide film, and (ii) specifically how to carry out the scanning method.

(Principle of Scanning Method)

(Electrochemical Reaction Occurring During Spark)

In a case where a probe is brought into contact with an aluminum oxide film that is formed on metallic aluminum and a spark electric current is caused to flow between the metallic aluminum and the probe, the aluminum oxide film is melted for an extremely short time of not longer than 1 μs. It is considered that a molten salt reaction represented by a formula (7) occurs in a case where a metallic aluminum side is an anode (positive), and a molten salt reaction represented by a formula (8) occurs in a case where the metallic aluminum side is a cathode (negative).

In a case where the metallic aluminum side is an anode, $4Al + 3O_2 \rightarrow 4Al^{3+} + 6O^{2-}$  (7)

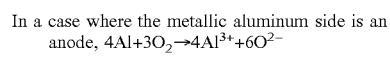

In a case where the metallic aluminum side is a cathode, $4Al^{3+} + 6O^{2-} \rightarrow 4Al + 3O_2$  (8)

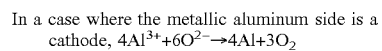

According to this reaction, electricity in a quantity of 6 Faraday (F) is consumed in forming 1 mol of $Al_2O_3$ (actually, $2Al^{3+} + 3O^{2-}$) (the formula (7)) or decomposing 1 mol of $Al_2O_3$ (the formula (8)). $Al_2O_3$ that has a molecular weight M (101.96 g/mol) and a density ρ ($4.0 \times 106$ g/m$^3$) has a volume per mol of M/ρ (m$^3$/mol). A volume of $Al_2O_3$ that is formed or decomposed by consumption of electricity in a quantity of 1 F is M/6ρ (m$^3$/F). A volume of $Al_2O_3$ that is formed or decomposed by consumption of electricity in a quantity of 1 C is calculated by substituting M and ρ into the following equation: $M/(6\rho F_c) = 4.4 \times 10^{-11}$ (m$^3$/C). Note, however, that Fc is a Faraday constant (1F=96500C).

Thus, $V_m$ (m$^3$), which is (i) a volume of a semiconductor layer that is formed by electricity in a quantity of Q (C) or (ii) a volume of $Al_2O_3$ that is decomposed, is expressed by the following equation: $V_m = MQ/(6\rho F_c) = 4.4 \times 10^{-11} \cdot Q$ (9).

Next, a density $N_{AO}$ (/m$^3$) of $Al_2O_3$ is expressed by the following equation, $N_{AO} = \rho A_v/M$ (10), where $A_v$ is Avogadro's number ($6.022 \times 10^{23}$/mol). Q (C), which is coulomb amount involved in formation of a semiconductor is expressed by the following equation, Q=it (11), where i is an electric current (A) and t is a time (s) of electric conduction. In a case where $Q_n$ is a quantity (C) of electricity used to form n mol of $Al_2O_3$ and $F_c$ is a Faraday constant (c/mol), the following equation, $n = Q_n/(6 F_c)$ (12), holds true based on $Q_n = 6 F_c n$. Based on the equation (11), the following equation, $n = it/(6 F_c)$ (13), holds true. Furthermore, $\Delta N_{AO}$, which is the number of n mol of $Al_2O_3$ formed or the number of n mol of $Al_2O_3$ decomposed is represented by the following equation: $\Delta N_{AO} = A_v n/V_m$ (14). $\Delta N_{AO}$ is expressed by the following equation, $\Delta N_{AO} = A_v it/(6 F_c V_m)$ (15), based on the equation (13). Since 2 mol of $Al^{3+}$ is generated with respect to 1 mol of $Al_2O_3$, $\Delta N_{Al}$, which is the number of n mol of Al formed or the number of n mol of Al decomposed, is represented by the following equation: $\Delta N_{Al} = A_v it/(3 F_c V_m)$ (16). Since 3 mol of $O^{2-}$ is generated with respect to 1 mol of $Al_2O_3$, $\Delta N_O$, which is the number of n mol of O formed or the number of n mol of O decomposed, is represented by the following equation: $\Delta N_O = A_v it/(2 F_c V_m)$ (17).

(Molten Salt Reaction Occurring in Case Where Metallic Aluminum Side is Anode)

Next, the following description discusses a scanning method as a method for moving a position of a tip of a probe on an aluminum oxide film surface 201. FIG. 18 is a conceptual diagram of semiconductor layers (a semiconductor layer 202 that is being formed and a semiconductor layer 203 that has been formed) formed, by scanning and based on a reaction formula, i.e., the formula (7), under a condition that the probe is brought into contact with the aluminum oxide film surface 201 on metallic aluminum and a metallic aluminum side is an anode. An area of actual contact of the probe with the aluminum oxide film surface 201 is smaller than an area of the tip of the probe. However, it is assumed here that the probe is brought into contact with the aluminum oxide film surface 201 in a rectangular region of $u_1$ (m)×$u_2$ (m). While a spark electric current i (A) is caused to flow between the metallic aluminum and the probe, scanning is carried out with use of the probe at a constant rate v (m/s) in a direction of an arrow so that the semiconductor layer is formed. A thickness of the semiconductor layer is increased by a spark so as to grow to h (m). A rectangular parallelepiped-shaped semiconductor layer having a width $u_2$ (m) and a thickness h (m) is formed by continuously carrying out scanning. Since scanning is carried out in an actual operation while an applied voltage is made constant, the spark electric current is considered to be gradually stabilized at an approximately constant value while fluctuating. However, for convenience, it is assumed here that the spark electric current i is a constant electric current.

A time for which the semiconductor layer is formed by the spark electric current i, i.e., a time t for which a contact surface of the tip of the probe passes through the region of $u_1 \times u_2$ is expressed by the following equation: $t = u_1/v$.

A quantity Q of electricity passed is expressed by the following equation: $Q = u_1 i/v$ (18). $V_m$, which is a volume of the semiconductor layer to be formed for the time t, is expressed by the following equation: $V_m = u_1 u_2 h$. Thus, h is expressed by the following equation: $h = V_m/(u_1 u_2)$ (19). In a case where the equation (9) and the equation (18) are substituted into the equation (19), h is expressed by the following equation: $h = 4.4 \times 10^{-11} \cdot i/(u_2 v)$ (20). By this, i is expressed by the following equation: $i = 2.3 \times 10^{10} \cdot u_2 v h$ (21).

Assuming here that a width ($u_2$) of the contact surface of the tip of the probe, the width extending in a direction perpendicular to a direction in which scanning is carried out, is 10 μm, a scanning velocity (v) is 14.6 μm/s, and the thickness (h) of the semiconductor layer to be formed is 50 nm, a necessary spark electric current value (i) is calculated. In a case where $u_2 = 1.0 \times 10^{-5}$ (m), $v = 14.6 \times 10^{-6}$ (m/s), and $h = 5.0 \times 10^{-8}$ (m) are substituted into the equation (21), $i \approx 1.7 \times 10^{-7}$ (A), so that a spark electric current value of 0.17 μA is necessary.

(Molten Salt Reaction Occurring in Case Where Metallic Aluminum Side is Cathode)

Figure 19:
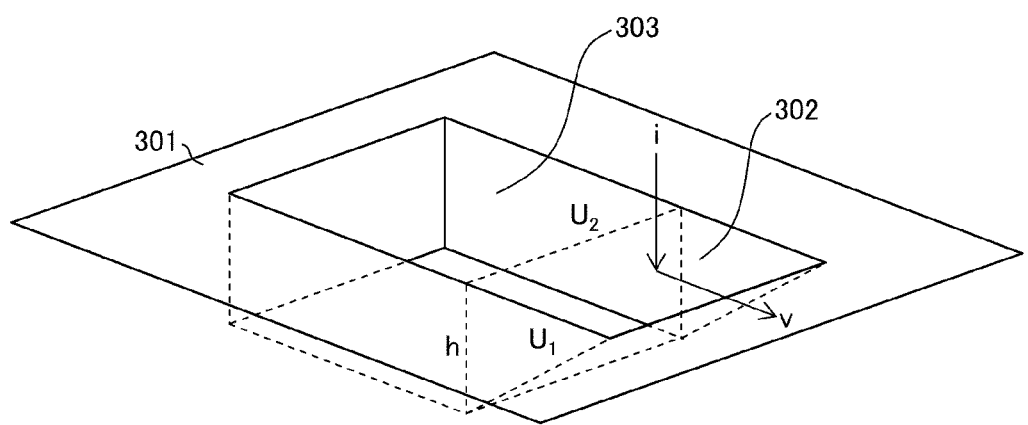
FIG. 19 is a view illustrating a method for decomposition reaction of an aluminum oxide layer while scanning the aluminum oxide layer with a probe tip.

FIG. 19 is a conceptual diagram of semiconductor layers (a semiconductor layer 302 that is being decomposed and a semiconductor layer 303 that has been decomposed) formed, by scanning and based on a reaction formula, i.e., the formula (8), under a condition that the probe is brought into contact with an aluminum oxide film surface 301 on metallic aluminum and a metallic aluminum side is a cathode. In this case, since a semiconductor layer is formed by decomposition of the aluminum oxide film, the aluminum oxide film is depressed by scanning. The semiconductor layer is formed by the aluminum oxide film that has remained. Thus, a condition under which to produce the semiconductor layer needs to be selected so that a thickness of the aluminum oxide film on the metallic aluminum is greater than a height by which the aluminum oxide film is depressed by scanning. A specific description of FIG. 19 is omitted here because FIG. 19 is identical to FIG. 18 in a case where "formation" in the above specific description of FIG. 18 is read as "decomposition".

(Method for Scanning)

Figure 20:
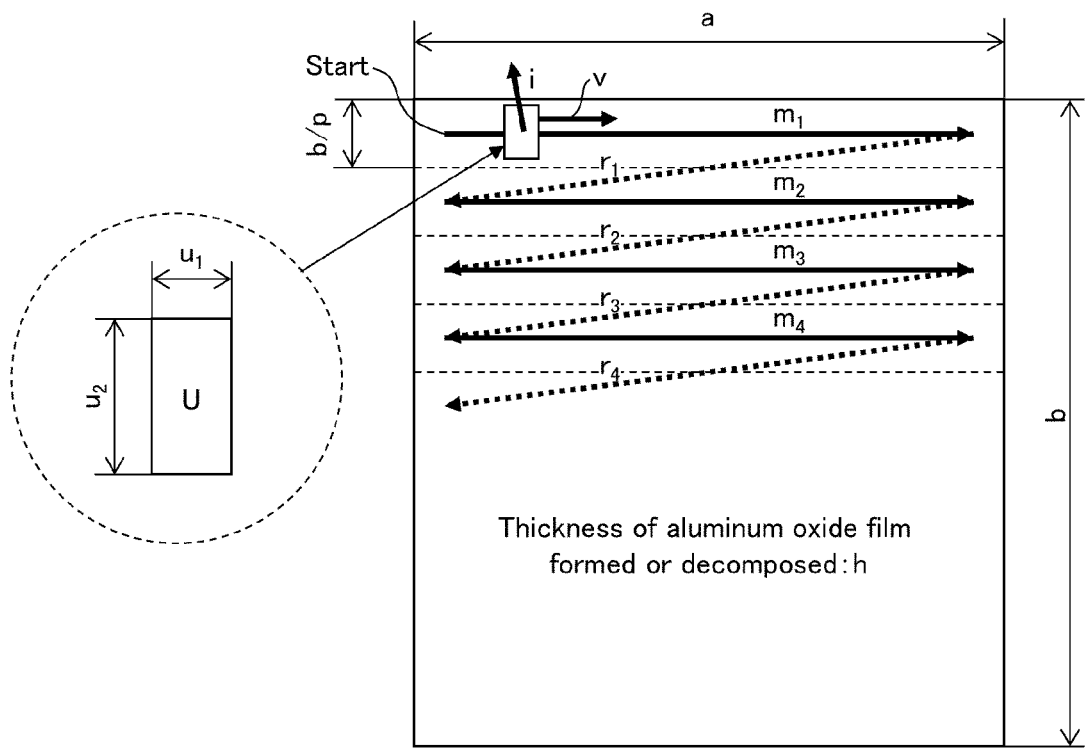
FIG. 20 is a view showing an example of a pattern of scanning carried out with use of a probe tip.

FIG. 20 shows an example of a scanning pattern. In order that a semiconductor layer is formed or decomposed, scanning is carried out while a probe is in contact with an aluminum oxide film. This results in formation of the semiconductor layer in a region of a (m)×b (m). A region U in which the semiconductor layer is formed at a certain instant is a part to a whole of which a spark electric current flows by a contact of a tip of the probe with the aluminum oxide film. The region U is the region of $u_1 \times u_2$ (described earlier). The tip of the probe is subjected to scanning carried out at a velocity v in a region of a×b, as indicated by arrows, while the spark electric current i is caused to flow to the aluminum oxide film.

First scanning is an operation to (i) move the probe to a starting point of FIG. 20 so as to bring the tip of the probe into contact with a sample and (ii) turn on i by application of a spark voltage V so as to immediately move the probe from the left to the right along a top line $m_1$. i is turned off by making V zero at the right end so as to temporarily separate the probe from the sample. Then, the probe is moved to a lower line by a return $r_1$ so as to be moved to the left end of the second line.

Second scanning is an operation to (i) bring the tip of the probe into contact with the sample again at the left end of the second line and (ii) turn on i by application of a voltage V so as to immediately move the probe from the left to the right along the second line $m_2$. i is turned off by making V zero at the right end so as to separate the probe from the sample. Then, the probe is moved to a lower line by a return $r_2$ so as to be moved to the left end of the third line.

Such a back-and-forth movement is repeated, and scanning is finished when the tip of the probe reaches the right end of the last line. In this case, assuming that a resolution of a vertical axis is p, a pitch of the vertical axis is b/p (m).

Note here that, in a case where $u_2$ and b/p are in a relationship of $u_2 = b/p$, according to calculation, in the entire scanned region of a×b, the semiconductor layer is formed so as to have a uniform thickness, or the aluminum oxide film is decomposed so as to have a uniform thickness. In a case where $u_2$ and b/p are in a relationship of $u_2 < b/p$, a part in which no semiconductor layer is formed or no aluminum oxide film is decomposed is linearly generated. In a case where $u_2$ and b/p are in a relationship of $u_2 > b/p$, a part in which the semiconductor layer is excessively formed or the aluminum oxide film is excessively decomposed is linearly generated. A result that is actually obtained may be not in accordance with calculation. Thus, by repeating trial production and a change in condition, it is possible to form a semiconductor layer that has been scaled up.

(Setting of Scanning Condition)

Here, a relationship with a scanning condition is found, the scanning condition being set for a carrier concentration of a semiconductor layer that is desired to be formed with use of a spark electric current. The carrier concentration is classified into (i) a donor density, which is present at a donor level that increases in accordance with a concentration of $Al^{3+}$ ions that are excessively injected into the semiconductor layer, and (ii) an acceptor density, which is present at an acceptor level that increases in accordance with a concentration of $O^{2-}$ ions that are excessively injected into the semiconductor layer. Calculation is carried out by taking the donor density, i.e., the concentration of $Al^{3+}$ ions as an example.

An $Al^{3+}$ ion concentration $C_{A1}$ (/m³) is obtained by multiplying, by an efficiency $\eta_{A1}$, a concentration $\Delta N_{A1}$ (/ m3) of Al that is formed or decomposed by sparking an aluminum oxide film. Thus, the equation (16) is expressed as below.

$$C_{A1} = \eta_{A1} \Delta N_{A1} = \eta_{A1} A_v it/(3 F_c V_m) \quad (22)$$

Note here that $V_m = u_1 u_2 h$ and $t = u_1/v$. Thus, in a case where these equations are substituted into the equation (22), the following equation, $C_{A1} = \eta_{A1} \cdot A_v/(3 F_c u_2 h) \cdot i/v$, holds true.

Thus, a scanning velocity v (m/s) of a probe during scanning, a flowing electric current i (A), a thickness h (m) of an aluminum oxide film formed or decomposed, a width $u_2$ (m) of the probe, the width extending in a direction perpendicular to a direction in which scanning is carried out, an efficiency $\eta_{A1}$ of carrier generation, and an $Al^{3+}$ ion concentration $C_{A1}$ (/m³) are represented by the following equation (23):

$$C_{A1} = 2.08 \times 10^{18} \cdot i/(u_2 h v) \cdot \eta_{A1} \quad (23).$$

(Specifications of Scanning Apparatus)

Specifications of an apparatus obtained by providing a scanning probe microscope (JSPM-5200, manufactured by JEOL Ltd.) with an electrically conductive probe were examined for a possibility of formation of a semiconductor layer with use of the apparatus. As a result of this, specifications of an apparatus used to form a semiconductor layer by a scanning method are as shown in Table 1.

TABLE 1

Specifications of JSPM-5200 used in scanning method

| Item | Specifications |
|---|---|
| Maximum applied voltage | ±60 V |
| Maximum electric current | 1 µA, 100 nA, 10 nA |
| Maximum range of scanning | 25 µm × 25 µm |
| Resolving power | 512 × 512, 1024 × 1024 |
| Scanning velocity | 488 nm/s-732 µm/s |

According to the present apparatus, it is possible to carry out scanning while applying a constant voltage between the probe and a sample, but it is impossible to carry out constant electric current scanning. Note, however, that it is possible to set a maximum electric current by setting a range of a measured electric current.

(Calculation Carried Out with Respect to Formation by Scanning Method)

(Formation of High Carrier Concentration Semiconductor Layer)

Calculation was carried out with use of JSPM-5200 with respect to formation of a semiconductor layer by a scanning method. For example, an electric current value i obtained in a case where an electric current flows in a direction that is in accordance with the formula (7), an aluminum oxide film serving as a base is a naturally oxidized film, and $C_{A1}$ is a high concentration of $1 \times 10^{28}$ (/m³) was calculated based on the equation (23). In a case where the width $U_2$ of the tip of the probe is $1 \times 10^6$ m (1.0 µm), the height h of the semiconductor layer formed is $2 \times 10^{-8}$ m (20 nm), the scanning velocity v is $1.46 \times 10^{-5}$ m/s (14.6 µm/s), and the efficiency $\eta_{A1}$ of carrier generation is 0.1, $i = 1.4 \times 10^{-8}$ (A), i.e., 14 nA. Use of a range of a maximum electric current of 10 nA causes $C_{A1}$ to be slightly lower but makes it possible to form the semiconductor layer.

(Formation of Low Carrier Concentration Semiconductor Layer)

A case where an electric current flows in a direction that is in accordance with the formula (7) and $C_{A1}$ is a low concentration of $1 \times 10^{25}$ (/m³) was discussed. In this case, the concentration is three-digit lower than in the case of the high concentration. This makes it necessary to three-digit lower the electric current value, three-digit increase the velocity, or change setting of both the electric current value and the velocity. Note, however, that both the electric current value that is three-digit lowered and the velocity that is three-digit increased are set beyond a range of the specifications of the apparatus. Thus, it is impossible to form a low carrier concentration semiconductor layer with use of the present apparatus. A semiconductor layer that can be formed with use of the present apparatus is limited to a high carrier concentration semiconductor layer.

(Further Increase in Area)

As described earlier, a range of scanning carried out one time is limited to 25 µm². Thus, in order to enlarge the range, it is necessary to carry out scanning a plurality of times. However, though it takes 30 minutes to carry out measurement one time, it takes a long time to carry out measurement a plurality of times. A further increase in area will be separately discussed.

(Another Method for Increase in Area)

According to the semiconductor layers described earlier, a pn junction is formed by simultaneously generating a p-type semiconductor and an n-type semiconductor by a spark method. Such a method cannot necessarily be said to be a method that is suitable for mass production so that the pn junction actually serves as a semiconductor device (e.g., a diode or a transistor) or an oscillation element.

The present semiconductor device is desirably configured to (i) allow a thin film to be formed by sputtering, which is a conventional semiconductor manufacturing technique, and (ii) allow a device structure to be formed by photolithography and etching. Under the circumstances, the following description discusses a method for obtaining a semiconductor layer of an aspect of the present invention by sputtering.

For example, as illustrated in FIG. 8, a semiconductor layer that has been formed by a spark method has an outermost surface in which a p-type semiconductor layer in which $O^{2-}$ is in excess is present. A part different from this part (surface) is masked so that this part, which serves as a target material, is sputtered. A semiconductor device is thus formed. An n-type semiconductor layer in which $Al^{3+}$ is in excess can be obtained by (i) proceeding with the sputtering so as to carry out the sputtering until an n-type semiconductor layer is extracted or (ii) switching between an anode and a cathode by reversing a direction in which an electric current flows during a spark, causing a surface of the semiconductor layer to be an n-type semiconductor layer, and causing the n-type semiconductor layer to serve as a target material. Alternatively, it is possible to carry out scanning (described earlier) so as to increase an area of the target material.

A pn junction can be obtained by this method in a case where, for example, a semiconductor layer in which $Al^{3+}$ is in excess is used as a target material to form an n-type semiconductor thin film on an aluminum substrate (serving also as a cathode electric current collecting material) by sputtering, a semiconductor layer in which $O^{2-}$ is in excess is subsequently used as a target material to form a p-type semiconductor thin film on the n-type semiconductor thin film by sputtering, and a cathode terminal is further attached to a p-type semiconductor layer.

A carrier concentration of a semiconductor layer can be controlled by changing an amount of electricity flowing during a spark. It is also possible to manufacture a semiconductor device such as a MOS-FET by using another material and repeating sputtering, photolithography, and etching.

Embodiment 3

(Oscillation Element)

Embodiment 3 of the present invention is described below with reference to FIGS. 21 to 29.

(Comparison with Patent Literature 1)

First, before specifically describing a semiconductor layer in accordance with an aspect of the present invention, the following description discusses an overview of an oscillation element including the semiconductor layer. The inventor of the present invention specifically describes the oscillation element in Patent Literature 1. The following description of the oscillation element is a part of a disclosure of Patent Literature 1. Thus, a reader of the present specification is advised to see Patent Literature 1 for further details of the oscillation element.

Figure 21:
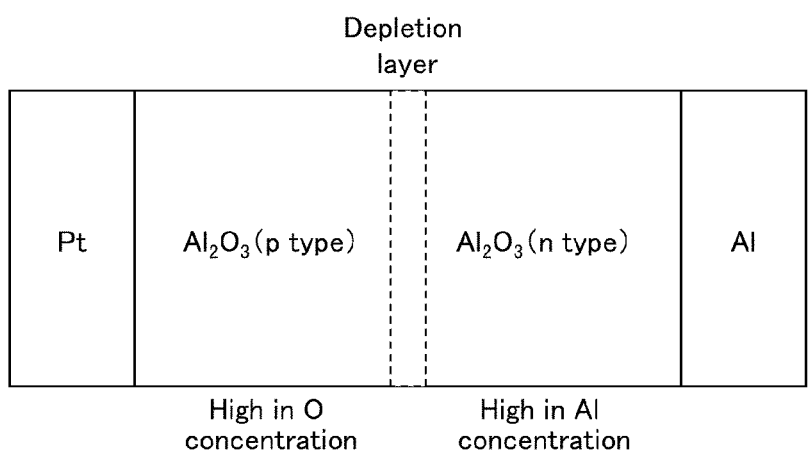
FIG. 21 is a view schematically illustrating a configuration of an oscillation element.

FIG. 21 is a cross-sectional view schematically illustrating a main part of a structure of an oscillation element of Embodiment 3. The structure of the oscillation element is identical to that of the pn junction diode formed by the spark method described earlier and illustrated in FIG. 17.

Figure 22:
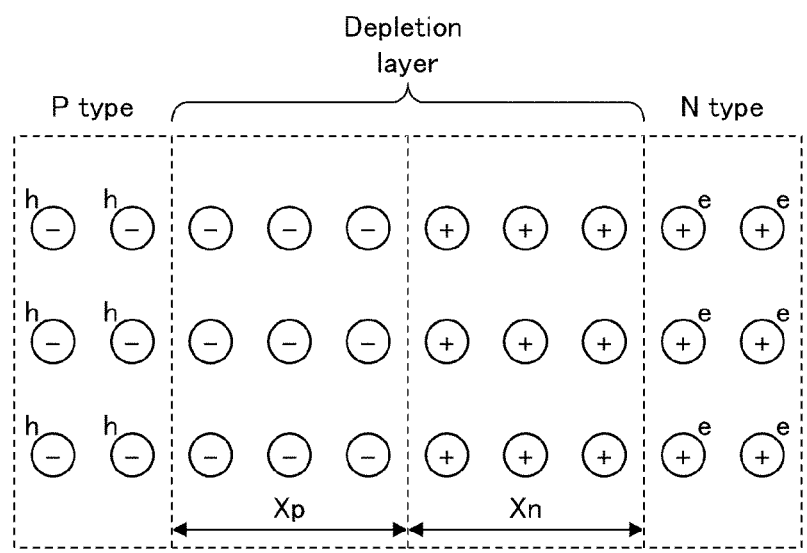
FIG. 22 is a view schematically illustrating a configuration of a depletion layer at a pn junction.

FIG. 22 illustrates a configuration of a depletion layer. In an n-type semiconductor, O is depleted from $Al_2O_3$ and Al is in excess, and cations of $Al^{3+}$ and electrons for maintaining electroneutrality are present. In a p-type semiconductor, Al is depleted from $Al_2O_3$ and O is in excess, and anions of $O^{2-}$ and holes for maintaining electroneutrality are present. Near a junction of the n-type semiconductor and the p-type semiconductor, the electrons of the n-type semiconductor and the holes of the p-type semiconductor combine and disappear, so that a part in which no electron and no hole are present is produced. This part is the depletion layer.

An oscillation element can be formed by making the depletion layer extremely thin. The depletion layer needs to have a thickness of not more than 1 nm. A size of one molecule of $Al_2O_3$ is calculated here. In a case where Avogadro's number is $6.022 \times 10^{23}$ (1/mol) and $Al_2O_3$ has a molecular weight of 101.96 (g/mol) and a density of $4.0 \times 10^3$ (kg/m$^3$), a volume occupied by one molecule of $Al_2O_3$ is $4.23 \times 10^{-29}$ (m$^3$). In a case where the volume occupied by one molecule of $Al_2O_3$ is assumed to be a cube and a length $d_m$ of substantially one side of the cube is calculated, $d_m$ is $3.5 \times 10^{-10}$ (m), i.e., 0.35 nm. Oscillation is considered to occur under a condition that the depletion layer has a thickness $x_{dep}$ that is not more than 3 times greater than $d_m$. Thus, the depletion layer desirably has a thickness $x_{dep}$ of not more than 1 nm.

The depletion layer can be made thin by increasing a concentration of carriers (holes) of the p-type semiconductor, a concentration of carriers of the n-type semiconductor, or a concentration of carriers of both the p-type semiconductor and the n-type semiconductor. Note here that a thickness $X_p$ of a p side depletion layer and a thickness $X_n$ of an n side depletion layer can be found by the following equations where $N_A$ is an acceptor concentration and $N_D$ is a donor concentration. Note, however, that a higher carrier concentration is considered to cause a greater error and the following equations merely serve as a rough standard and are not strict formulas.

The thickness of the p side depletion layer is expressed by the following equation:

$$x_p = \sqrt{\frac{2\varepsilon V_{bi}}{qN_A} \frac{N_D}{N_A + N_D}} \quad (22)$$

The thickness of the n side depletion layer is expressed by the following equation:

$$x_n = \sqrt{\frac{2\varepsilon V_{bi}}{qN_D} \frac{N_A}{N_A + N_D}} \quad (23)$$

However, $$V_{bi} = \frac{k_B T}{q} \ln\left(\frac{N_A \cdot N_D}{n_i^2}\right) \quad (24)$$

where $V_{bi}$ is built-in potential (V), $n_i$ is a carrier concentration (m$^{-3}$) of an intrinsic semiconductor, $X_p$ is a width (m) of a depletion layer of a p-type region, $X_n$ is a width (m) of a depletion layer of an n-type region, $k_B$ is Boltzmann constant ($1.38 \times 10^{-23}$ (J/K)), T is a temperature (K), q is an elementary electric charge of $1.602 \times 10^{-19}$ (C), $\varepsilon_r$ is a relative dielectric constant, and $\varepsilon_0$ is a dielectric constant under vacuum ($8.854 \times 10^{-12}$ (F/m)).

In a case where a bias voltage is $V_D$ (V), the thickness $x_{dep}$ of the depletion layer as a whole is expressed as below.

$$x_{dep} = x_p + x_n = \sqrt{\frac{2\varepsilon}{q} \frac{N_A + N_D}{N_A N_D}(V_{bi} - V_D)} \quad (25)$$

Assuming here that $N = N_A = N_D$, a carrier concentration N in which $x_{dep}$ is 1 nm was found. In a case where $\varepsilon_r$ of $Al_2O_3$ is 8.9 and $V_D = 0$ (V), $N = 2.6 \times 10^{27}$ (m$^{-3}$). In general, in a case where a carrier concentration is increased by an ion implantation method, a high carrier concentration frequently refers to a carrier concentration of not less than $1 \times 10^{27}$ (m$^{-3}$). Thus, this N value can also be said to be a high carrier concentration.

Figure 23:
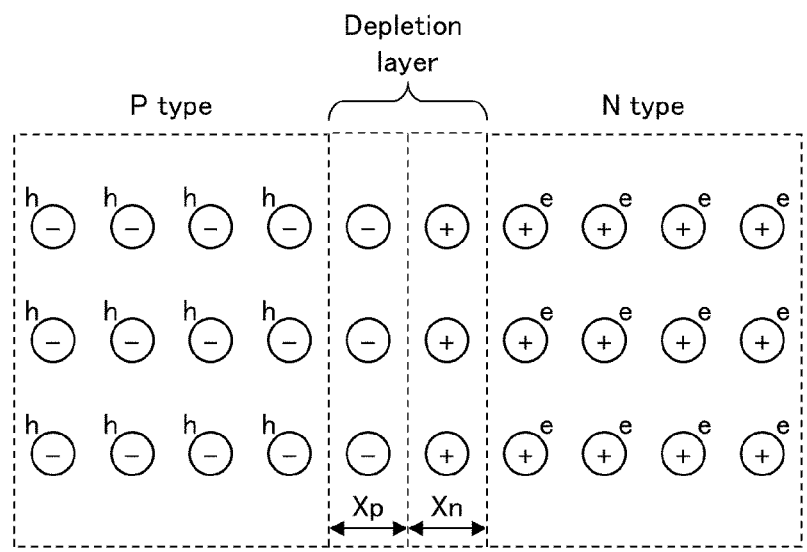
FIG. 23 is a view schematically illustrating a configuration of the depletion layer of FIG. 22 which depletion layer has an extremely thin thickness.

In contrast, in order to maximize an amplitude of an oscillating electric current, it is necessary to make the depletion layer thinner as illustrated in FIG. 23. It is desirable to set a value of $x_{dep}$ to approximately 0.35 nm. N that is similarly found in this case is $2.3 \times 10^{28}$ (m$^{-3}$), which is a concentration that is approximately one-digit higher than $2.6 \times 10^{27}$ (m$^{-3}$). An Al concentration in $Al_2O_3$ molecules can be calculated as $4.73 \times 10^{28}$ (m$^{-3}$), and an O concentration in the $Al_2O_3$ molecules can be calculated as $7.09 \times 10^{28}$ (m$^{-3}$). Thus, this N value can be said to be an ultrahigh carrier concentration. In a case where a carrier concentration is extremely high, a maximum electric current amplitude of oscillation is obtained, so that stable oscillation is achieved.

(a) and (b) of FIG. 24 each show an example of an I-V characteristic obtained during oscillation. In FIG. 24, a negative region and a positive region of a bias voltage (horizontal axis) indicate a forward bias side and a backward bias side, respectively. A phenomenon of electric current oscillation occurred at a bias voltage in a range of −0.1 V to +0.1 V in (a) of FIG. 24 and at a bias voltage in a range of −0.2 V to +0.17 V in (b) of FIG. 24. FIG. 25 shows an oscillation waveform of (a) of FIG. 24. An oscillating electric current was generated at an amplitude of approximately −0.4 μA to +0.4 μA. At a bias voltage of 0 V, an oscillating electric current was also generated at a similar amplitude. A frequency was approximately 3.4 kHz.

In the I-V characteristic of FIG. 24, in a case where attention was paid to an electric current generated at a bias voltage that does not oscillate (in (a) of FIG. 24, −0.6 V to −0.1 V and +0.1 V to +0.6 V, and, in (b) of FIG. 24, −0.6 V to −0.2 V and +0.17 V to +0.6 V), the electric current was substantially symmetric with respect to the origin, and no rectifying characteristic was observed. In general, a pn junction diode has a rectifying characteristic. However, even the present oscillation element that has a pn junction is considered to display no rectifying characteristic. This is (i) because the present oscillation element that has an extremely high carrier concentration and whose depletion layer has a thickness of not more than 1 nm causes an electric current to be passed, by a tunnel effect, through a surface in which a p-type semiconductor and an n-type semiconductor are joined or (ii) because the present oscillation element that has an extremely high carrier concentration metallizes a film electronic state, so that high electric conductivity is obtained.

(Estimation of Oscillation Mechanism)

Next, the following description discusses how the inventor considers an oscillation mechanism. A mechanism of electric current oscillation of the present oscillation element is merely hypothetical. It should be noted that it is necessary to carry out more in-depth research in order to obtain an overall picture of the mechanism.

The following description more specifically discusses the configuration of the depletion layer at the pn junction (see FIG. 22). FIG. 26 illustrates an electric field in the depletion layer in a case where a carrier concentration is relatively low. The electric field is considered to be roughly classified into two types. $E_a$ of the first type is an electric field that is applied to a part in which a cation surface and an anion surface in the depletion layer face each other. In $E_a$, cations and anions are pulled by a force of $f_a$. A distance between respective central parts of a cation and an anion is considered to be approximately 0.35 nm. $E_b$ of the second type is an electric field that is applied to an electron surface (n-type semiconductor side) and a hole surface (p-type semiconductor side) that are present outside the depletion layer. In $E_b$, cations and anions are pulled by a force of $f_b$. The distance is approximately several nm. $E_a$ and $E_b$ are opposite in direction, and $E_a \gg E_b$, so that $f_a \gg f_b$. $E_a$ and $E_b$ are each substantially an electrostatic force exerted between an innermost cation and an innermost anion.

In contrast, FIG. 27 illustrates a case where a carrier concentration is extremely high and a width of the depletion layer is approximately 0.35 nm. In this case, $E_a = E_b$. This causes a force exerted between innermost ions (an innermost cation and an innermost anion) and a force exerted between an innermost electron and an innermost hole to be equal. Specifically, an innermost cation and an innermost anion are released from the electrostatic force, so that only an attractive force acts between the innermost cation and the innermost anion. This attractive force is considered to be a force such as a van der Waals force. Thus, the innermost cation and the innermost anion vibrate in accordance with a Newton's equation of motion. The innermost cation and the innermost anion also vibrate at a bias voltage of 0 V.

The following description estimates the reason why a bias voltage that oscillates (−0.1 V to +0.1 V) and bias voltages that do not oscillate (−0.6 V to −0.1 V and +0.1 V to +0.6 V) are generated in the I-V characteristic of FIG. 24. As illustrated in FIG. 28, application of a bias voltage in a forward direction causes the thickness $x_{dep}$ of the depletion layer to be smaller in accordance with the equation (25). Application of 0.1 V causes $x_{dep}$ to be as small as 0.34 nm according to calculation. In this case, $E_b > E_a$. It is considered that a Newtonian motion is prevented or reduced due to action of an electric field and consequently electric current oscillation does not occur. As illustrated in FIG. 29, application of a bias voltage in a backward direction causes the thickness $x_{dep}$ of the depletion layer to be larger in accordance with the equation (25). Application of −0.1 V causes $x_{dep}$ to be as large as 0.36 nm according to calculation. In this case, $E_a > E_b$. It is considered that a Newtonian motion is prevented or reduced due to action of an electric field and consequently electric current oscillation does not occur. The mechanism of electric current oscillation has been thus estimated.

The following description more specifically describes the present invention with reference to Examples. Note, however, that the present invention is not limited to the Examples.

EXAMPLE 1

First, Example 1 prepared an aluminum plate (1085 material, 12 mm×30 mm, a thickness of 0.2 mm). This sample was dipped in pure water heated to 95° C., and a boehmite-treated film having a thickness of approximately 20 nm was formed on the aluminum plate. Next, the manual prober 20 was prepared. A probe obtained by (i) sharpening a tip of a platinum wire (H material) having a diameter of 0.2 mm so that the tip has a diameter of 0.02 mm and (ii) causing a root of the platinum wire to be in coil form was used. The apparatus 10 illustrated in FIG. 2 was prepared, and devices were connected as illustrated in FIG. 2.

The electric current limiting resistor 15 was set to 100Ω, the shunt resistor 14 was set to 100Ω, an output of a direct current stabilizing power supply was set to 36 V, and the switch of the switch box 13 was closed after a probe tip was brought into contact with the sample in atmosphere. A spark was carried out between the probe tip and the aluminum plate. In a part with which the probe tip had been brought into contact, a semiconductor layer having a thickness of approximately 30 nm was formed. A change in voltage applied to the sample in this case and a change in electric current flowing to the sample in this case were measured with use of the oscilloscope 12. Immediately after an electric current flowed to the sample, a voltage of 36 V was momentarily applied to the sample, but the voltage decreased to approximately 10 V immediately. An electric current was approximately 0.1 A. This state continued for 0.3 μs.

(Result of I-V Measurement)

After electric conduction was finished, a state of the probe was maintained as it was, and a connection of the I-V measurement of FIG. 2 was switched to the I-V measurement so that the I-V measurement was carried out with respect to a resultant semiconductor layer. A result of this is shown in FIG. 4. Scanning was carried out while a voltage was continuously changed in a range of −0.6 V to 1.0 V at a velocity of 0.1 V/s. A substantially linear relationship was obtained in a voltage range of −0.55 V to +0.2 V. It is considered that a tunnel current or an electric current caused by a metallized electron state of the film flowed between the aluminum plate and the probe in this voltage range. At a voltage of not more than −0.55 V and in a voltage range of +0.2 V to +0.55 V, a current-voltage relationship deviated from the linear relationship, so that a large electric current flowed. In a voltage range of +0.55 V to +1.0 V, little electric current flowed. It is currently unclear why the current-voltage relationship deviates from the linear relationship in such a wide voltage range. However, it is considered that a carrier behavior of the semiconductor layer is in an unstable state. In a case where a short circuit occurs between the aluminum plate and the probe, the linear relationship should be obtained in an entire voltage region of the I-V characteristic. However, since no short circuit occurs between the aluminum plate and the probe, the linear relationship is a characteristic unique to the semiconductor layer formed.

EXAMPLE 2

As in the case of Example 1, Example 2 prepared an aluminum plate (1085 material, 20 mm×60 mm, a thickness of 0.18 mm). This sample was dipped in pure water heated to 95° C., and a boehmite-treated film having a thickness of approximately 20 nm was formed on the aluminum plate.

The electric current limiting resistor 15 illustrated in FIG. 2 was changed from 100Ω to 1 kΩ, the probe tip was brought into contact with the boehmite-treated film, and a spark was carried out by a method identical to the method described earlier, so that a semiconductor layer was formed. In this case, a voltage and an electric current of the sample were similar in behavior to those of FIG. 3. Note, however, that time required for molten salt electrolysis decreased to approximately 30 ns, and the electric current decreased to approximately 0.03 A. Coulomb amount required for a molten salt electrolysis reaction was approximately 1/100 of that required in the example described earlier.

(Result of I-V Measurement)

Note here that FIG. 5 shows an I-V characteristic of the semiconductor layer formed. A negative electric current flowed at a voltage of not more than −0.6 V. In contrast, at a voltage of more than −0.6 V, no electric current flowed, and a rectifying characteristic was displayed. A pn junction was formed in the semiconductor layer, so that a pn junction diode was formed in which the semiconductor layer had an n-type semiconductor on the aluminum plate side and had a p-type semiconductor on the probe side.

EXAMPLE 3

Example 3 prepared the following sample first. An aluminum plate (24 mm×24 mm, a thickness of 0.1 mm) was used as a substrate, 5 N aluminum Al (manufactured by Furuuchi Chemical Corporation, 76 mm in diameter×6 mm in thickness) was used as a target material, and sputtering was carried out for approximately 40 minutes under conditions of Ar+$O_2$ gas and a full pressure of 0.4 Pa, so that an aluminum oxide film of approximately 30 nm was sputtered on the aluminum plate. A sputtering device used was SPC-350 manufactured by Nichiden Anelva Corporation.

Next, JSPM-5200 was used to form a semiconductor layer by a scanning method. A probe whose tip had a width of 1.0 μm was prepared, and scanning was carried out at a scanning velocity of 14.6 μm/s and an electric current value of 10 nA, so that an element having a size of 25 μm×25 μm was formed.

(Result of I-V Measurement)

An I-V characteristic was measured by bringing a probe identical to that of Example 1 into contact with a surface of the element produced by sputtering. A linear relationship was obtained in a voltage range of −0.5 V to +0.5 V. It is considered that a tunnel current or an electric current caused by a metallized electron state of the film flowed between the aluminum plate and the probe in this voltage range. At a voltage of not more than −0.5 V and a voltage of not less than +0.5 V, little electric current flowed between the aluminum plate and the probe. Though no rectifying action was obtained, an I-V characteristic unique to the present semiconductor device in which a carrier concentration is high was obtained.

(Formation of Low Carrier Concentration Semiconductor Layer)

A case where a carrier concentration is made low (e.g., 1×$10^{25}$ ($m^{-3}$)) was discussed. In this case, the concentration is three-digit lower than in the case of the high concentration. This makes it necessary to three-digit lower the electric current value, three-digit increase the velocity, or change setting of both the electric current value and the velocity. Note, however, that both the electric current value that is three-digit lowered and the velocity that is three-digit increased are set beyond a range of the specifications of the apparatus. Thus, it was impossible to form a low carrier concentration semiconductor layer with use of the present apparatus. A semiconductor layer that can be formed with use of the present apparatus is limited to a high carrier concentration semiconductor layer.

EXAMPLE 4

Example 4 prepared the following sample. An aluminum plate (24 mm×24 mm, a thickness of 0.1 mm) was used as a substrate, 5 N aluminum Al (manufactured by Furuuchi Chemical Corporation, 76 mm in diameter×6 mm in thickness) was used as a target material, and sputtering was carried out for approximately 40 minutes under conditions of Ar+$O_2$ gas and a full pressure of 0.4 Pa, so that an aluminum oxide thin film of approximately 30 nm was sputtered on the aluminum plate. A sputtering device used was SPC-350 manufactured by Nichiden Anelva Corporation.

The electric current limiting resistor 15 was set to 100Ω, the shunt resistor 14 was set to 100Ω, an output of a direct current stabilizing power supply was set to 60 V, and the switch of the switch box 13 was closed after a probe tip was brought into contact with the sample in atmosphere. A spark was carried out between the probe tip and the aluminum plate. In a part with which the probe tip had been brought into contact, a semiconductor layer having a thickness of approximately 50 nm was formed. A change in voltage applied to the sample in this case and a change in electric current flowing to the sample in this case were measured with use of the oscilloscope 12. Immediately after an electric current flowed to the sample, a voltage of 60 V was momentarily applied to the sample, but the voltage decreased to approximately 10 V immediately. An electric current was approximately 0.2 A. This state continued for 0.3 μs.

(Result of I-V Measurement)

FIG. 24 shows an example of the I-V characteristic. In FIG. 24, a negative region and a positive region of a bias voltage (horizontal axis) indicate a forward bias side and a backward bias side, respectively. A phenomenon of electric current oscillation occurred at a bias voltage in a range of −0.1 V to +0.1 V. FIG. 25 shows an oscillation waveform. An oscillating electric current was generated at an amplitude of approximately −0.4 μA to +0.4 μA. At a bias voltage of 0 V, an oscillating electric current was also generated at a similar amplitude. A frequency was approximately 3.4 kHz.

[Applications of the Present Invention]

An aluminum oxide in accordance with an aspect of the present invention which aluminum oxide is formed as a semiconductor layer is not $Al_2O_3$ (O/Al=1.5), which is a stoichiometric substance, but a p-type semiconductor in which Al is depleted or O is in excess (O/Al>1.5) and an n-type semiconductor in which Al is in excess or O is depleted (O/Al<1.5). A pn junction of a p-type semiconductor layer and an n-type semiconductor layer which pn junction is obtained by adjusting each of carrier concentrations of the p-type semiconductor layer and the n-type semiconductor layer to not more than $10^{27}/m^3$ serves as a diode. In a case where (i) the p-type semiconductor layer and the n-type semiconductor layer whose carrier concentrations have been adjusted as appropriate and (ii) an insulator such as stoichiometric aluminum oxide are three-dimensionally combined, a semiconductor device such as a transistor or a thyristor is obtained. Such a semiconductor device can be expected to be used as a power semiconductor having a wide band gap. Furthermore, the semiconductor device with which characteristics of a transparent oxide semiconductor are combined is adaptable to a component of a solar battery and a display panel.

In contrast, a pn junction of a p-type semiconductor layer and an n-type semiconductor layer which pn junction is obtained by adjusting each of carrier concentrations of the p-type semiconductor layer and the n-type semiconductor layer to $10^{28}$ to $10^{29}/m^3$ serves as an oscillation element and can be expected to be applied to an inverter that converts a direct electric current into an alternating electric current. The oscillation element with which characteristics of a transparent oxide semiconductor and an ultraviolet region light emitting diode are combined serves as a frequency variable inverter. This allows an inverter to be adapted in a wider range. Furthermore, since such a high carrier concentration metallizes a semiconductor layer electronic state, so that highly satisfactory electric conductivity is obtained. This makes it possible to expect the element to serve as a high performance electric conductor. Furthermore, the element with which characteristics of a transparent oxide semiconductor are combined can also be used as a transparent electric conductor.

A p-type semiconductor layer and an n-type semiconductor layer in accordance with an aspect of the present invention serve as an extremely high oxidizing agent or an extremely high reducing agent and thus are promising also as a new chemical substance. Furthermore, the p-type semiconductor layer and the n-type semiconductor layer with each of which characteristics of a transparent oxide semiconductor are combined may also be applicable to a fuel cell electrode material and a photosynthetic electrode. Moreover, the p-type semiconductor layer and the n-type semiconductor layer can be expected to be applied to a target material of a semiconductor.

The present invention is not limited to the embodiments, but can be altered by a skilled person in the art within the scope of the claims. The present invention also encompasses, in its technical scope, any embodiment derived by combining technical means disclosed in differing embodiments.

REFERENCE SIGNS LIST

10 Apparatus
11 Stabilized direct current power supply
12 Oscilloscope
13 Switch box
14 Shunt resistor
15 Electric current limiting resistor
20 Manual prober
21 Manipulator
22 Switch
23 I-V measuring device
101 Probe
101a Probe tip
102 Aluminum oxide film
103 Metallic aluminum
201, 301 Aluminum oxide film surface
202, 203, 302, 303 Semiconductor layer

The invention claimed is:

1. A semiconductor layer comprising:
   a pn junction at which an n-type semiconductor layer and a p-type semiconductor layer are joined, the n-type semiconductor layer having a donor level that is formed by causing an aluminum oxide film to excessively contain aluminum, the p-type semiconductor layer having an acceptor level that is formed by causing an aluminum oxide film to excessively contain oxygen.

2. A semiconductor layer comprising a p-type semiconductor layer having an acceptor level that is formed by causing an aluminum oxide film to excessively contain oxygen.

3. A method for manufacturing a semiconductor layer, comprising the steps of:
   bringing metallic aluminum and a probe into contact with a first surface and a second surface, respectively, of an aluminum oxide film so as to melt the aluminum oxide film in atmosphere, oxygen-containing gas, or oxygen gas by applying, between the metallic aluminum serving as an anode and the probe serving as a cathode, a voltage at which a dielectric breakdown occurs in the aluminum oxide film; and
   by causing, in the aluminum oxide film which is being melted, a molten salt electrolysis reaction so as to cool the aluminum oxide film, forming an n-type semiconductor layer and a p-type semiconductor layer on the metallic aluminum side and the probe side, respectively, of the aluminum oxide film, and joining the n-type semiconductor layer and the p-type semiconductor layer.

4. The method as set forth in claim 3, wherein the molten salt electrolysis reaction is caused in the aluminum oxide film by making a donor concentration of the n-type semiconductor layer and an acceptor concentration of the p-type semiconductor layer controllable by adjusting coulomb amount that causes the molten salt electrolysis reaction.

5. The method as set forth in claim 3, wherein the molten salt electrolysis reaction is caused in the aluminum oxide film by moving the probe while bringing the probe into contact with the aluminum oxide film.

6. The method as set forth in claim 3, wherein the probe which is being brought into contact with the aluminum oxide film is moved by (1) continuously changing the applied voltage, (2) discontinuously changing the applied voltage, (3) unidirectionally or bidirectionally changing a polarity of the applied voltage, or changing the applied voltage by combining (1) through (3).

7. A method for manufacturing a semiconductor layer, comprising the steps of:
   bringing metallic aluminum and a probe into contact with a first surface and a second surface, respectively, of an aluminum oxide film so as to melt the aluminum oxide film in atmosphere, gas, or a vacuum by applying, between the metallic aluminum serving as a cathode and the probe serving as an anode, a voltage at which a dielectric breakdown occurs in the aluminum oxide film; and by causing, in the aluminum oxide film which is being melted, a molten salt electrolysis reaction so as to cool the aluminum oxide film, forming a p-type semiconductor layer and an n-type semiconductor layer on the metallic aluminum side and the probe side, respectively, of the aluminum oxide film, and joining the n-type semiconductor layer and the p-type semiconductor layer.

8. An oscillation element comprising:

a pn junction at which an n-type semiconductor layer and a p-type semiconductor layer are joined, the n-type semiconductor layer having a donor level that is formed by causing an aluminum oxide film to excessively contain aluminum, the p-type semiconductor layer having an acceptor level that is formed by causing an aluminum oxide film to excessively contain oxygen.

9. A method for manufacturing an oscillation element, comprising the steps of:

bringing metallic aluminum and a probe into contact with a first surface and a second surface, respectively, of an aluminum oxide film so as to melt the aluminum oxide film in atmosphere, oxygen-containing gas, or oxygen gas by applying, between the metallic aluminum serving as an anode and the probe serving as a cathode, a voltage at which a dielectric breakdown occurs in the aluminum oxide film; and by causing, in the aluminum oxide film which is being melted, a molten salt electrolysis reaction so as to cool the aluminum oxide film, forming an n-type semiconductor layer and a p-type semiconductor layer on the metallic aluminum side and the probe side, respectively, of the aluminum oxide film, and joining the n-type semiconductor layer and the p-type semiconductor layer, a depletion layer, formed by joining the n-type semiconductor layer and the p-type semiconductor layer, having a thickness of not more than 1 nm.

10. The method as set forth in claim 9, wherein the molten salt electrolysis reaction is caused in the aluminum oxide film by moving the probe while bringing the probe into contact with the aluminum oxide film.

11. A method for manufacturing an oscillation element, comprising the steps of:

bringing metallic aluminum and a probe into contact with a first surface and a second surface, respectively, of an aluminum oxide film so as to melt the aluminum oxide film in atmosphere, gas, or a vacuum by applying, between the metallic aluminum serving as a cathode and the probe serving as an anode, a voltage at which a dielectric breakdown occurs in the aluminum oxide film; and by causing, in the aluminum oxide film which is being melted, a molten salt electrolysis reaction so as to cool the aluminum oxide film, forming a p-type semiconductor layer and an n-type semiconductor layer on the metallic aluminum side and the probe side, respectively, of the aluminum oxide film, and joining the n-type semiconductor layer and the p-type semiconductor layer, a depletion layer, formed by joining the n-type semiconductor layer and the p-type semiconductor layer, having a thickness of not more than 1 nm.

12. A method for manufacturing a semiconductor layer, comprising the steps of:

bringing metallic aluminum and a probe into contact with a first surface and a second surface, respectively, of an aluminum oxide film so as to melt the aluminum oxide film in atmosphere, oxygen-containing gas, or oxygen gas by applying, between the metallic aluminum serving as an anode and the probe serving as a cathode, a voltage at which a dielectric breakdown occurs in the aluminum oxide film; and by causing, in the aluminum oxide film which is being melted, a molten salt electrolysis reaction so as to cool the aluminum oxide film, (1) forming an n-type semiconductor layer on the metallic aluminum side of the aluminum oxide film or (2) forming a p-type semiconductor layer on the probe side of the aluminum oxide film.

13. A method for manufacturing a semiconductor layer, comprising the steps of:

bringing metallic aluminum and a probe into contact with a first surface and a second surface, respectively, of an aluminum oxide film so as to melt the aluminum oxide film in atmosphere, gas, or a vacuum by applying, between the metallic aluminum serving as a cathode and the probe serving as an anode, a voltage at which a dielectric breakdown occurs in the aluminum oxide film; and by causing, in the aluminum oxide film which is being melted, a molten salt electrolysis reaction so as to cool the aluminum oxide film, (1) forming an n-type semiconductor layer on the metallic aluminum side of the aluminum oxide film or (2) forming a p-type semiconductor layer on the probe side of the aluminum oxide film.

* * * * *